US011089689B2

(12) United States Patent
Li et al.

(10) Patent No.: US 11,089,689 B2
(45) Date of Patent: Aug. 10, 2021

(54) FINE FEATURE FORMATION TECHNIQUES FOR PRINTED CIRCUIT BOARDS

(71) Applicant: INTEL CORPORATION, Santa Clara, CA (US)

(72) Inventors: Eric Li, Chandler, AZ (US); Kemal Aygun, Tempe, AZ (US); Kai Xiao, Portland, OR (US); Gong Ouyang, Olympia, WA (US); Zhichao Zhang, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 295 days.

(21) Appl. No.: 16/081,487

(22) PCT Filed: Apr. 2, 2016

(86) PCT No.: PCT/US2016/025772
§ 371 (c)(1),
(2) Date: Aug. 31, 2018

(87) PCT Pub. No.: WO2017/171884
PCT Pub. Date: Oct. 5, 2017

(65) Prior Publication Data
US 2019/0098764 A1  Mar. 28, 2019

(51) Int. Cl.
*H05K 3/00* (2006.01)
*H05K 3/02* (2006.01)
(Continued)

(52) U.S. Cl.
CPC ......... *H05K 3/0026* (2013.01); *H05K 1/0228* (2013.01); *H05K 3/027* (2013.01); *H05K 3/4694* (2013.01); *H05K 2201/09227* (2013.01); *H05K 2201/09727* (2013.01); *H05K 2203/107* (2013.01); *H05K 2203/1476* (2013.01)

(58) Field of Classification Search
CPC .... H05K 1/0228; H05K 3/0036; H05K 3/027; H05K 3/4694; H05K 2203/107; H05K 2203/1476
See application file for complete search history.

(56) References Cited

U.S. PATENT DOCUMENTS

| 4,527,041 A | 7/1985 | Kai |
| 4,730,095 A | 3/1988 | Richter-Joergensen |

(Continued)

OTHER PUBLICATIONS

International Search Report dated Dec. 22, 2016 for International Patent Application No. PCT/US2016/025772.

*Primary Examiner* — Carl J Arbes
(74) *Attorney, Agent, or Firm* — Kacvinsky Daisak Bluni PLLC

(57) ABSTRACT

Fine feature formation techniques for printed circuit boards are described. In one embodiment, for example, a method may comprise fabricating a conductive structure 306 on a low density interconnect (LDI) printed circuit board (PCB) 150 according to an LDI fabrication process and forming one or more fine conductive features on the LDI PCB by performing a fine feature formation (FFF) process, the FFF process to comprise removing conductive material of the conductive structure along an excision path to form a fine gap region 308 within the conductive structure. Other embodiments are described and claimed.

25 Claims, 18 Drawing Sheets

(51) Int. Cl.
*H05K 1/02* (2006.01)
*H05K 3/46* (2006.01)

(56) References Cited

U.S. PATENT DOCUMENTS

| | | | | |
|---|---|---|---|---|
| 5,274,264 | A * | 12/1993 | Yung | H01L 22/22 |
| | | | | 257/529 |
| 5,636,172 | A * | 6/1997 | Prall | G11C 29/785 |
| | | | | 365/225.7 |
| 7,297,003 | B2 * | 11/2007 | Rathburn | H01R 12/57 |
| | | | | 439/591 |
| 7,701,035 | B2 * | 4/2010 | Greco | H01L 23/5258 |
| | | | | 257/529 |
| 9,368,450 | B1 * | 6/2016 | Gu | H01L 25/0655 |
| 9,774,117 | B1 * | 9/2017 | Jackson | H01L 23/49811 |
| 10,283,492 | B2 * | 5/2019 | Gamini | H01L 25/18 |
| 2006/0237069 | A1 | 12/2006 | Bromley et al. | |
| 2009/0056989 | A1 | 3/2009 | Bhir et al. | |
| 2009/0212317 | A1 | 8/2009 | Kolodin et al. | |

* cited by examiner

*LDI Fabrication Stage*

*Post-Processing Stage*

*LDI Fabrication Stage*

*Post-Processing Stage*

*LDI Fabrication Stage*

*Post-Processing Stage*

*LDI Fabrication Stage*

*Post-Processing Stage*

FINE FEATURE FORMATION TECHNIQUES FOR PRINTED CIRCUIT BOARDS

CROSS-REFERENCE TO RELATED APPLICATIONS

This application is a national phase claiming the benefit of and priority to International Patent Application No. PCT/US2016/025772, entitled "FINE FEATURE FORMATION TECHNIQUES FOR PRINTED CIRCUIT BOARDS" filed Apr. 2, 2016, which is hereby incorporated by reference in its entirety.

TECHNICAL FIELD

Embodiments herein generally relate to printed circuit boards (PCBs) and features thereof.

BACKGROUND

According to design rules for low density interconnect (LDI) PCBs, certain constraints are typically placed upon the dimensions of PCB features. Typical LDI PCB fabrication rules stipulate a minimum trace width of approximately 4.0 mils (or approximately 100 µm). Typical LDI PCB fabrication rules also stipulate a minimum spacing of approximately 4.0 mils (or approximately 100 µm), both with respect to the spacing between any two given traces and with respect to the spacing between any two particular portions of a given trace. The relative coarseness associated with LDI trace width and spacing requirements may preclude the use of LDI fabrication processes to form fine features on LDI PCBs. Such requirements may be circumvented via the use of high density interconnect (HDI) PCBs and fabrication processes. However, the use of an HDI PCB may significantly increase the overall board cost, potentially by orders of magnitude.

DETAILED DESCRIPTION

Various embodiments may comprise one or more elements. An element may comprise any structure arranged to perform certain operations. Each element may be implemented as hardware, software, or any combination thereof, as desired for a given set of design parameters or performance constraints. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

Figure 1A:
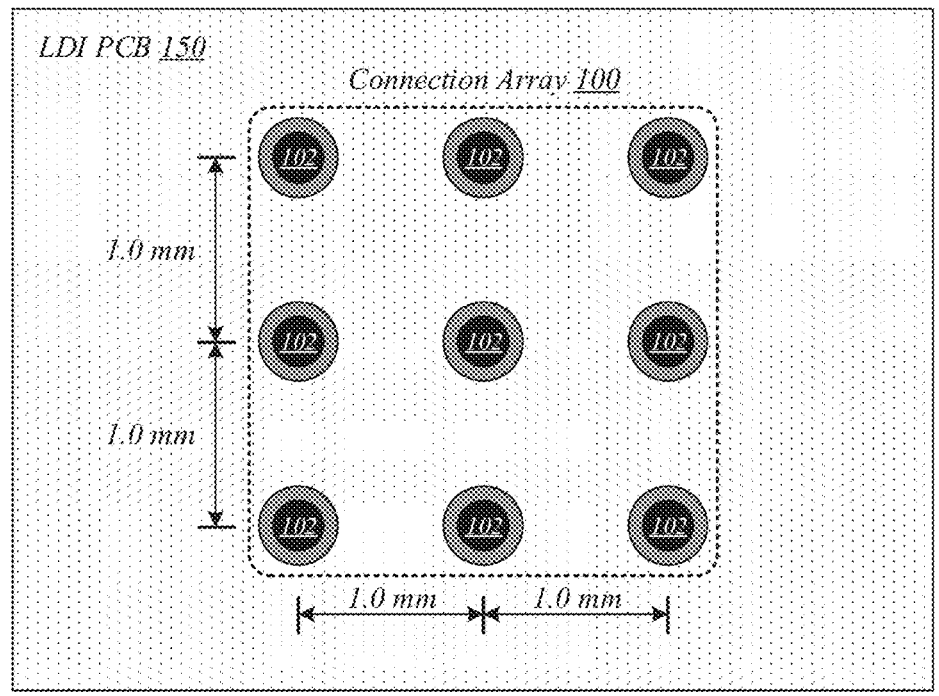
FIG. 1A illustrates an embodiment of a first connection array.

FIG. 1A illustrates a connection array 100 that generally comprises an example of a type of connection array that may be implemented on an LDI PCB. Connection array 100 is implemented on an LDI PCB 150, and consists of an array of connection elements 102, which may comprise conductive elements such as pads or vias. More particularly, connection array 100 consists of an array of connection elements 102 arranged in a grid featuring three rows and three columns. An inter-element pitch defines the center to center distance between rows and the center to center distance between columns With respect to connection array 100, the inter-element pitch is 1.0 mm. According to various embodiments, connection array 100 may be representative of some or all of a land grid array (LGA), pin grid array (PGA) or ball grid array (BGA). The embodiments are not limited in this context.

Figure 1B:
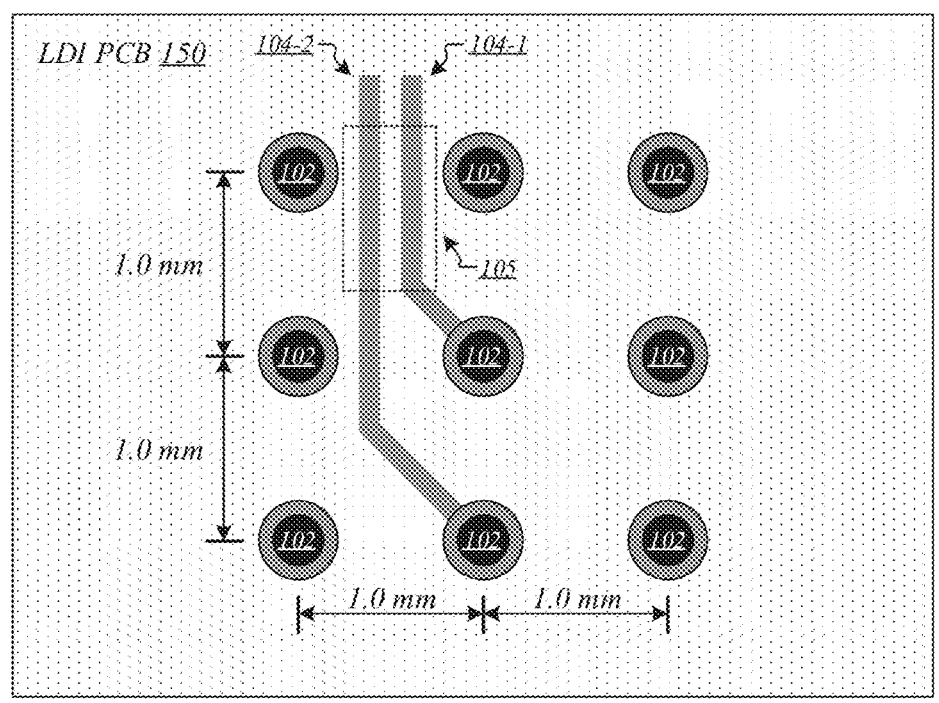
FIG. 1B illustrates an embodiment of a first breakout arrangement.

FIG. 1B illustrates an example of a breakout arrangement that may be possible to implement for connection array 100 of FIG. 1A using an LDI fabrication process. According to LDI design rules, a minimum spacing of approximately 100 µm (or approximately 4 mils) may be required between any two conductive traces/tracks, as well as between any given conductive trace/track and any given connection element 102. LDI design rules may also stipulate a minimum trace/track width of approximately 100 µm (or approximately 4 mils). The 1.0 mm inter-element pitch of connection array 100 may provide sufficient space between adjacent rows/columns of connection elements 102 to accommodate two conductive traces/tracks without violating such LDI design rules. Thus, for example, as illustrated in FIG. 1B, an LDI fabrication process may be used to fashion breakout tracks 104-1 and 104-2 that extend in parallel through a region 105 located between the first and second columns of connection elements 102.

Figure 2A:
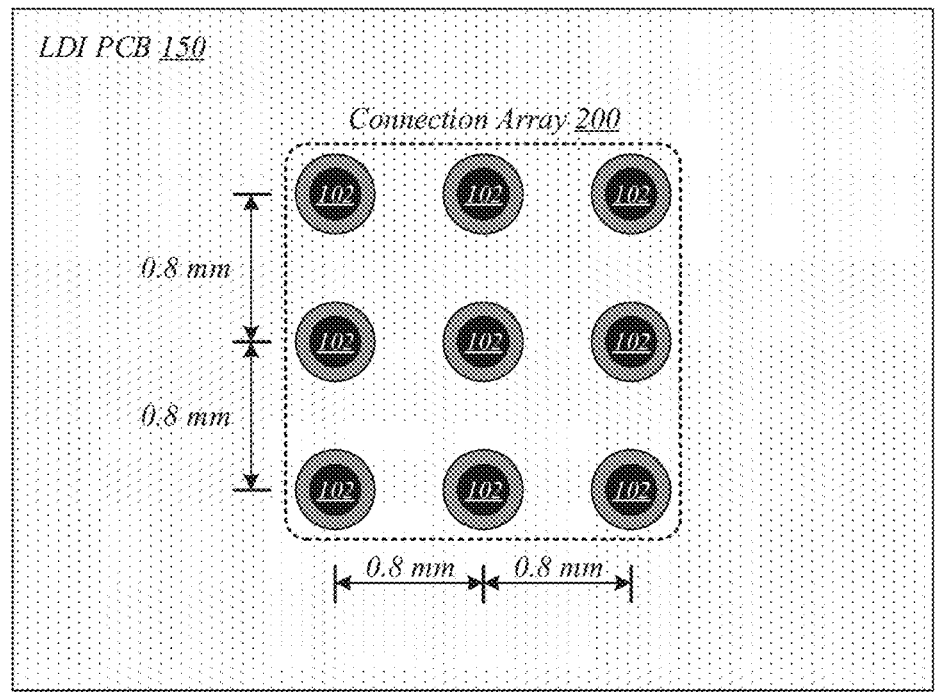
FIG. 2A illustrates an embodiment of a second connection array.

FIG. 2A illustrates a connection array 200 that generally comprises another example of a type of connection array that may be implemented on an LDI PCB. Like connection array 100 of FIGS. 1A and 1B, connection array 200 is implemented on an LDI PCB 150, and consists of an array of connection elements 102 arranged in a grid featuring three rows and three columns. However, rather than the 1.0 mm inter-element pitch featured in connection array 100, connection array 200 features an inter-element pitch of only 0.8 mm.

Figure 2B:
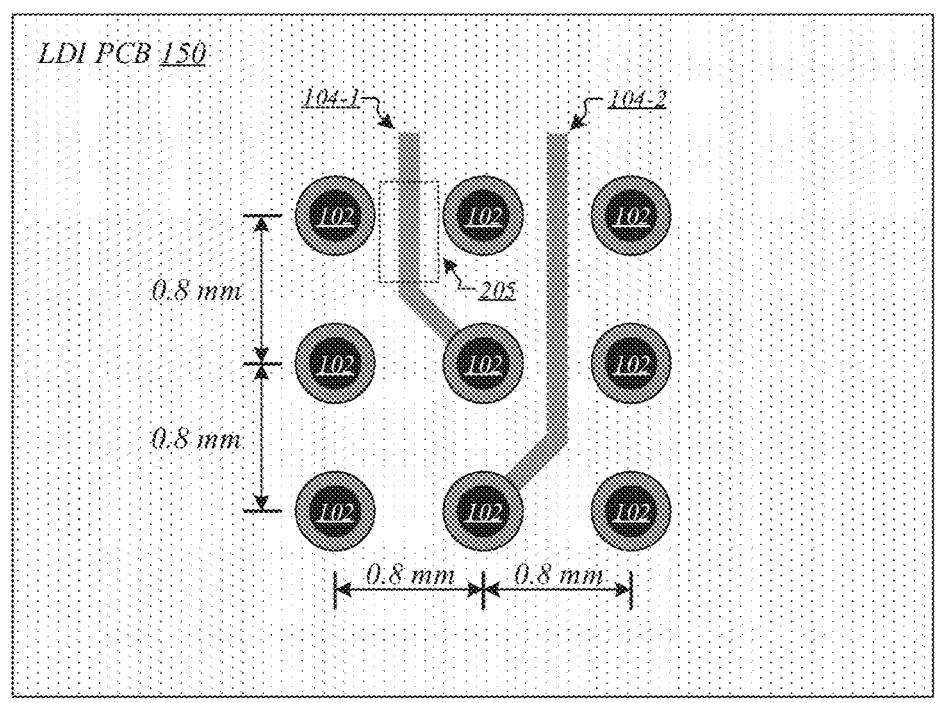
FIG. 2B illustrates an embodiment of a second breakout arrangement.

FIG. 2B illustrates an example of a breakout arrangement that it may be possible to implement for connection array 200 of FIG. 2A using an LDI fabrication process. The 0.8 mm inter-element pitch of connection array 200 may not provide sufficient space between adjacent rows/columns of connection elements 102 to accommodate multiple conductive traces/tracks without violating the aforementioned LDI design rules regarding trace widths and spacing. Thus, according to LDI design rules, it may only be possible to fit breakout track 104-1 in a region 205 located between the first and second columns of connection elements 102, and breakout track 104-2 may need to be routed along a different path.

Disclosed herein are fine feature formation (FFF) techniques, according to which fine features may be created on an LDI PCB such as LDI PCB 150. Various such techniques may generally involve forming one or more fine conductive features via post-processing of a conductive structure fabricated on an LDI PCB according to an LDI fabrication process. As employed herein in reference to a given feature, the term "fine" generally denotes that at least a portion of the feature is dimensioned and/or situated in a fashion that violates one or more LDI design rules regarding trace widths and spacing.

Figure 3:
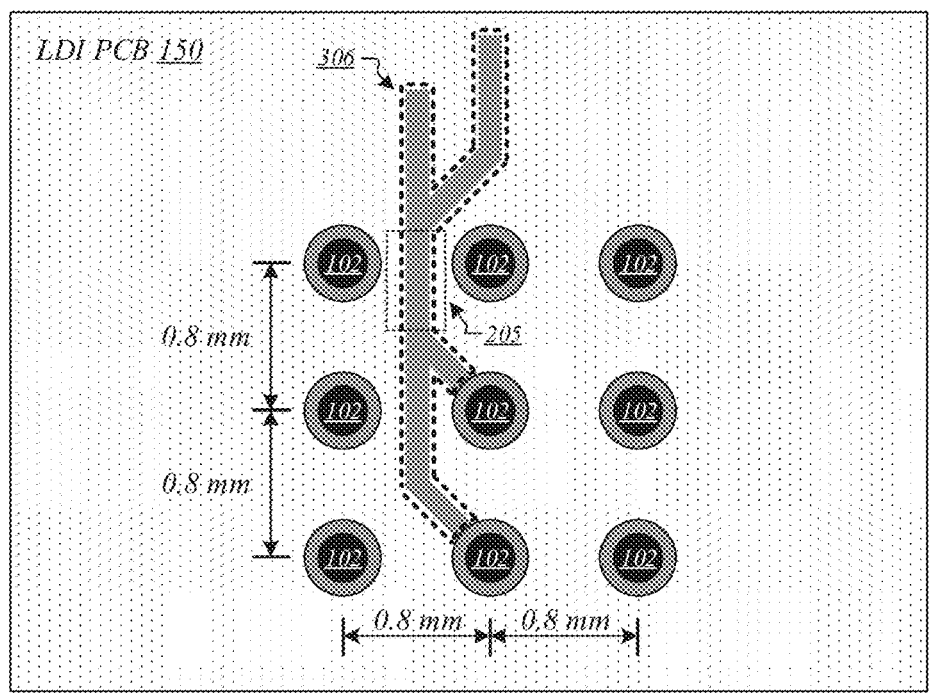
FIG. 3 illustrates an embodiment of a first fabrication procedure.
Figure 3:
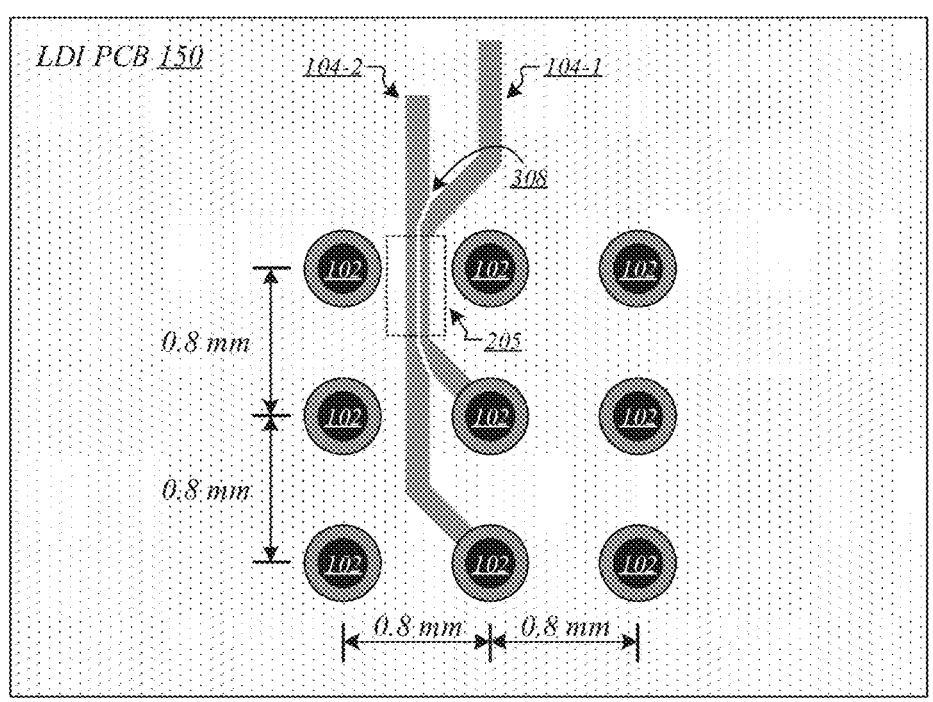

FIG. 3 illustrates an example of a fabrication procedure according to which FFF techniques may be used to realize an improved breakout track density with respect to a breakout arrangement for connection array 200 of FIGS. 2A and 2B. As reflected in FIG. 3, the fabrication procedure may include an LDI fabrication stage and a post-processing stage. During the LDI fabrication stage, a conductive structure 306 is fabricated on LDI PCB 150. Conductive structure 306 may generally be comprised of conductive material, such as copper or any other suitable conductive material. The portion of conductive structure 306 that is located within region 205 consists of a single trace, which may comprise a width corresponding to an LDI minimum trace/track width of approximately 100 μm (or approximately 4 mils). During the post-processing stage, a portion of conductive structure 306 is removed. More particularly, conductive material is removed to create a fine gap region 308, which divides conductive structure 306 to form breakout tracks 104-1 and 104-2. In various embodiments, the width of fine gap region 308 may comprise a width within a range of approximately 20-30 μm. In regions in which breakout tracks 104-1 and 104-2 are separated by fine gap region 308, breakout tracks 104-1 and 104-2 are narrower than the LDI minimum trace/track width, and the spacing between breakout tracks 104-1 and 104-2 is less than the LDI minimum spacing. As such, breakout tracks 104-1 and 104-2 constitute fine conductive features as implemented in FIG. 3.

According to the fabrication procedure of FIG. 3, breakout tracks 104-1 and 104-2 are both routed through region 205, freeing up the board space that would be occupied by breakout track 104-2 according to the LDI fabrication process of FIG. 2B. As such, for the same connection array 200, the fabrication procedure of FIG. 3 may be implemented to realize an improved breakout density relative to that which is possible according to the LDI fabrication process of FIG. 2B. The ability to configure breakout arrangements featuring such improved breakout densities may enable a given PCB design to be implemented using a reduced inter-element pitch (such as a 0.8 mm pitch rather than a 1.0 mm pitch) and/or using a reduced number of PCB layers. Support for a reduced inter-element pitch may enable a reduction in the form factor of a given bottom-side limited package, and/or or may enable an increase in the pin count supported by a package/socket of a given form factor. The embodiments are not limited in this context.

Figure 4:
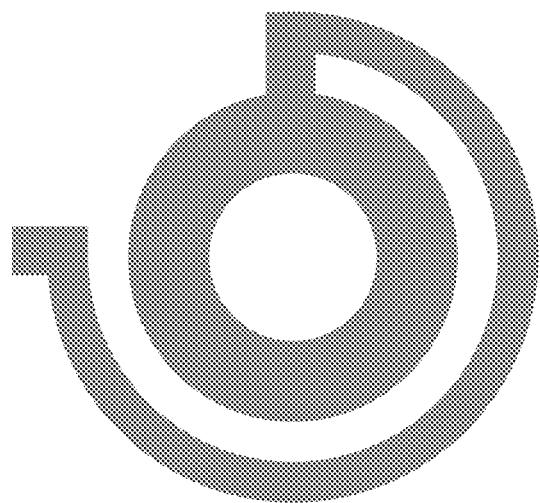
FIG. 4 illustrates an embodiment of an inductor coil.
Figure 4:
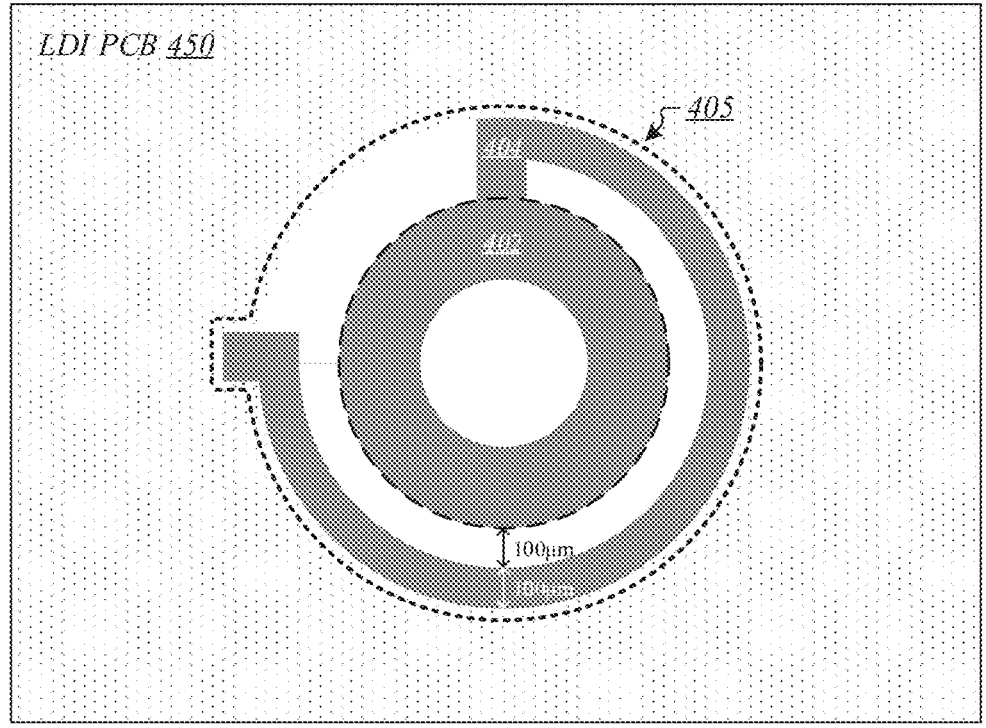

FIG. 4 illustrates an example of an inductor coil 400 that it may be possible to fabricate within a region 405 of an LDI PCB 450 using an LDI fabrication process. Region 405 may be limited by the existence of adjacent conductive features such as pads, traces, and so forth. Inductor coil 400 generally consists of a central portion 402 and a winding trace portion 404. Winding trace portion 404 comprises a thickness of approximately 100 μm (or approximately 4 mils), and is spaced approximately 100 μm (or approximately 4 mils) from central portion 402 as it winds around central portion 402. As can be seen in FIG. 4, region 405 is not large enough to accommodate multiple windings for inductor coil 400 according to LDI design rules, and inductor coil 400 features only ¾ of a turn.

Figure 5:
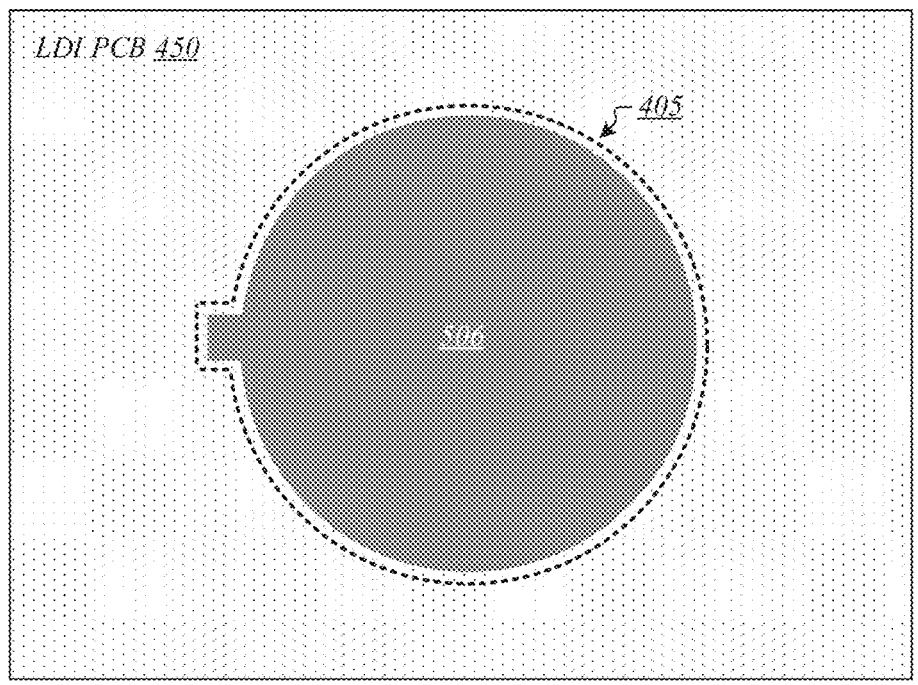
FIG. 5 illustrates an embodiment of a second fabrication procedure.
Figure 5:
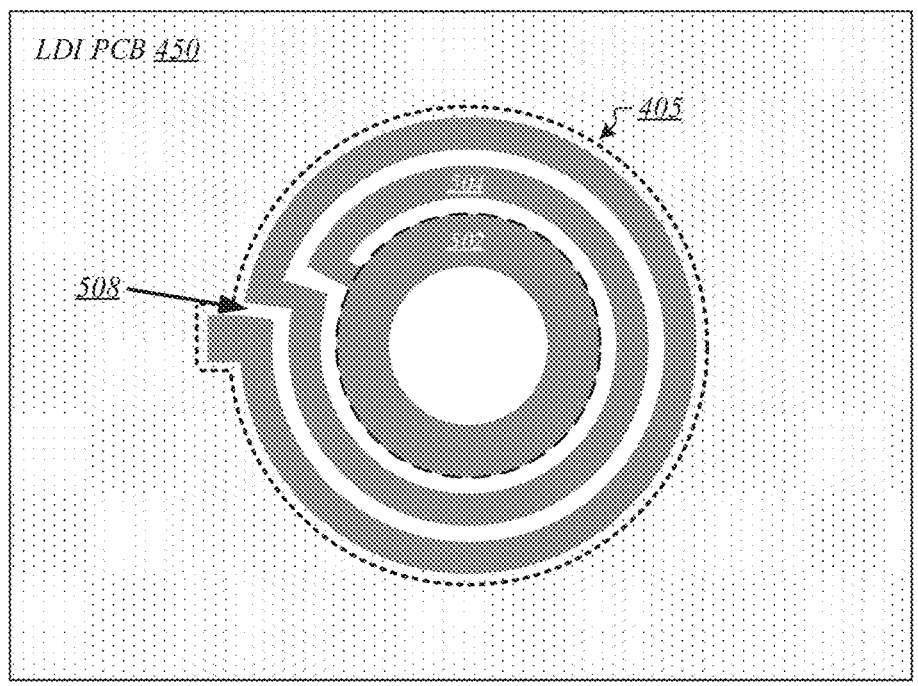

FIG. 5 illustrates an example of a fabrication procedure according to which FFF techniques may be used to form an inductor coil within region 405 of LDI PCB 450 of FIG. 4. As reflected in FIG. 5, the fabrication procedure may include an LDI fabrication stage and a post-processing stage. During the LDI fabrication stage, a conductive structure 506 is fabricated within region 405 of LDI PCB 450. Conductive structure 506 may generally comprise a pad or other structure formed of conductive material, such as copper or any other suitable conductive material. During the post-processing stage, a portion of conductive structure 506 is removed. More particularly, conductive material is removed to create a fine gap region 508. In various embodiments, the width of fine gap region 508 may comprise a width within a range of approximately 20-50 μm. Once the necessary portions of the conductive material of conductive structure 506 are removed to create fine gap region 508, the conductive material that remains forms an inductor coil. A winding trace portion 504 of the inductor coil winds around a central portion 502 approximately twice, and thus the inductor coil comprises a multi-turn inductor coil featuring approximately two turns. The width of winding trace portion 504 is less than the LDI minimum trace/track width, and the spacings between central portion 502 and the inner winding of winding trace portion 504 and between the inner and outer windings of winding trace portion 504 are less than the LDI minimum spacing. As such, the inductor coil that is formed according to the fabrication procedure of FIG. 5 constitutes a fine conductive feature.

Since the inductor coil of FIG. 5 features multiple turns, it may generally provide a higher amount of inductance at any given frequency than does the ¾-turn inductor coil 400. For example, the inductor coil of FIG. 5 may provide approximately four times more inductance at a 5 GHz frequency than does inductor coil 400. Such increased levels of inductance may potentially be leveraged, for example, for improvement of digital/DDR and/or high-speed input/output (HSIO) signaling performance and/or RF analog applications such as WiFi/Bluetooth analog components. The embodiments are not limited in this context.

Figure 6:
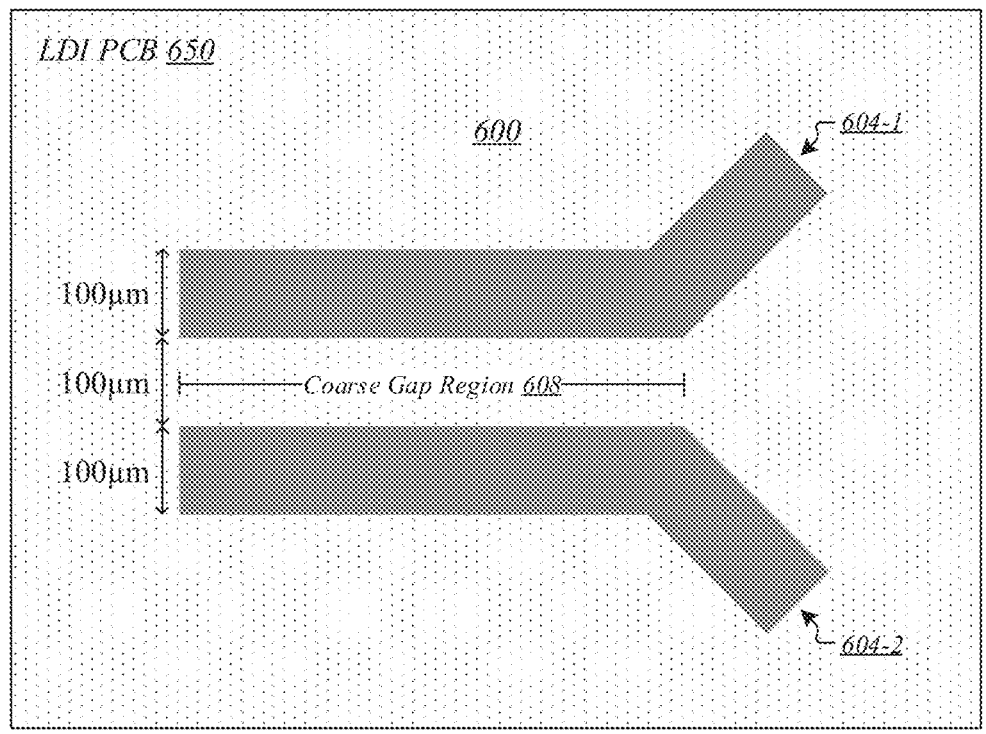
FIG. 6 illustrates an embodiment of a crosstalk mitigation structure.

FIG. 6 illustrates an example of a crosstalk mitigation structure 600 that it may be possible to fabricate on an LDI PCB 650 using an LDI fabrication process. Crosstalk mitigation structure 600 is formed by traces 604-1 and 604-2, which run in parallel to each other along the span of a coarse gap region 608. Traces 604-1 and 604-2 comprise widths corresponding to an LDI minimum trace/track width of approximately 100 μm (or approximately 4 mils). Coarse gap region comprises a width corresponding to an LDI minimum trace spacing of approximately 100 µm (or approximately 4 mils).

Figure 7:
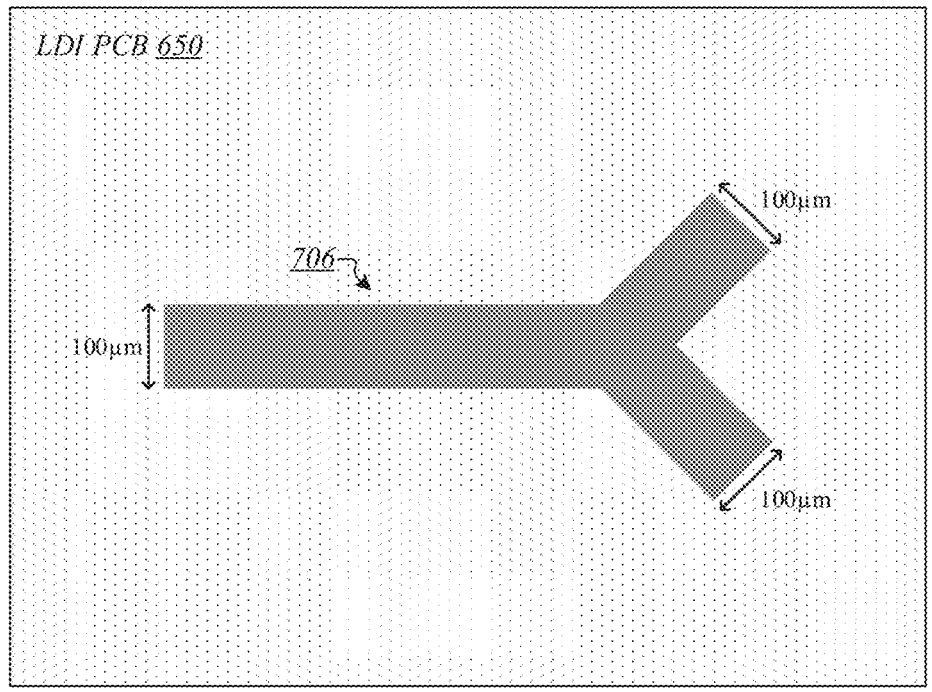
FIG. 7 illustrates an embodiment of a third fabrication procedure.
Figure 7:
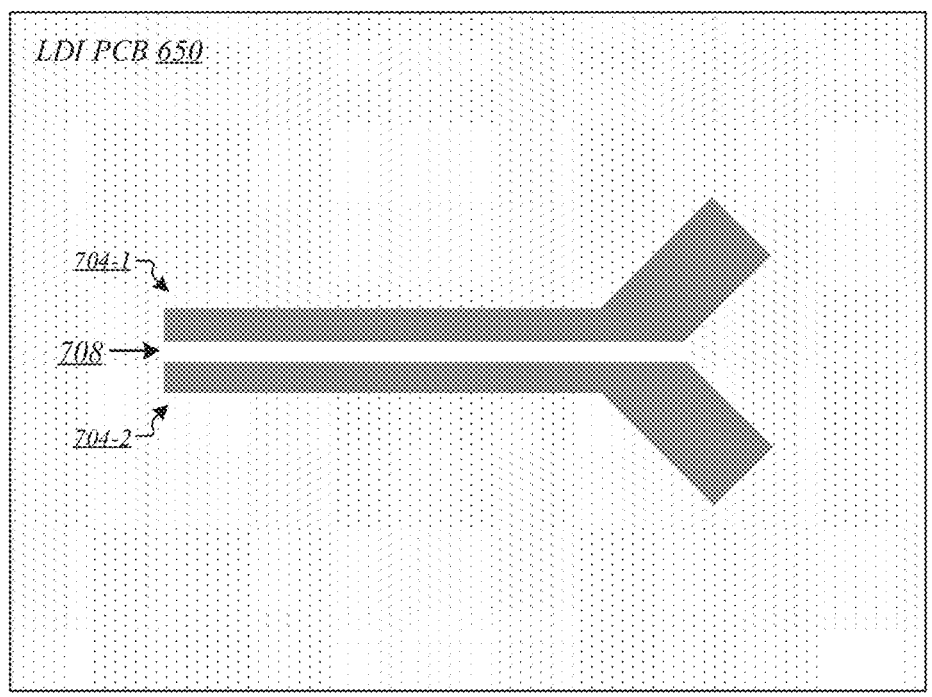

FIG. 7 illustrates an example of a fabrication procedure according to which FFF techniques may be used to form a crosstalk mitigation structure on LDI PCB 650 of FIG. 6. In some embodiments, the crosstalk mitigation structure formed according to the fabrication procedure of FIG. 7 may be used for far-end crosstalk mitigation. As reflected in FIG. 7, the fabrication procedure may include an LDI fabrication stage and a post-processing stage. During the LDI fabrication stage, a conductive structure 706 is fabricated on LDI PCB 650. Conductive structure 706 may generally be comprised of conductive material, such as copper or any other suitable conductive material. As shown in FIG. 7, in some embodiments, each of the three "branches" of conductive structure may comprise a width corresponding to an LDI minimum trace/track width of approximately 100 µm (or approximately 4 mils). During the post-processing stage a portion of conductive structure 706 is removed. More particularly, conductive material is removed to create a fine gap region 708, which divides conductive structure 706 to form traces 704-1 and 704-2. In various embodiments, the width of fine gap region 708 may comprise a width within a range of approximately 20-30 µm. In regions in which traces 704-1 and 704-2 are separated by fine gap region 708, traces 704-1 and 704-2 are narrower than the LDI minimum trace/track width, and the spacing between traces 704-1 and 704-2 is less than the LDI minimum spacing. As such, traces 704-1 and 704-2 constitute fine conductive features as implemented in FIG. 7.

Due to the fine spacing between traces 704-1 and 704-2, their mutual capacitance may be significantly higher than the mutual capacitance of the coarsely-spaced traces 604-1 and 604-2 of crosstalk mitigation structure 600 of FIG. 6. In some embodiments, for example, forming a crosstalk mitigation structure according to the fabrication procedure of FIG. 7 may potentially yield a mutual capacitance increase of approximately 60%, which may potentially reduce crosstalk by approximately 50%. Such improved crosstalk mitigation capabilities may potentially be leveraged, for example, to achieve improved digital/DDR and/or high-speed input/output (HSIO) signaling performance. Furthermore, the footprint of a crosstalk mitigation structure created according to the fabrication procedure of FIG. 7 may be smaller than that of crosstalk mitigation structure 600, and thus the aforementioned benefits may be realized in a manner that also saves board space. The embodiments are not limited in this context.

Figure 8:
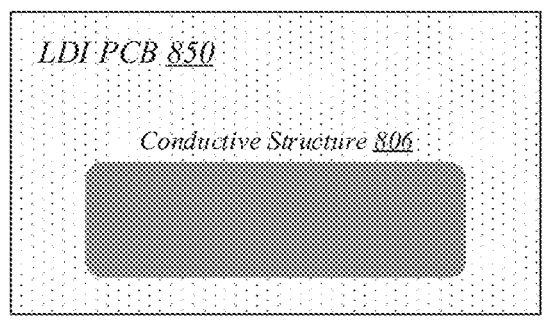
FIG. 8 illustrates an embodiment of a fourth fabrication procedure.
Figure 8:
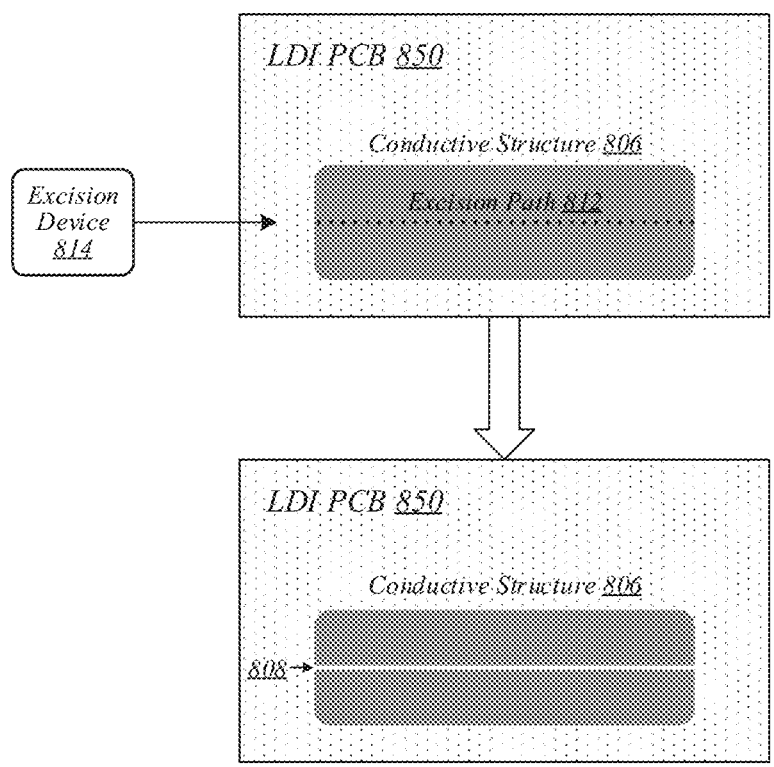

FIG. 8 illustrates an example of a fabrication procedure that may be representative of the implementation of one or more of the disclosed FFF techniques according to various embodiments. The fabrication procedure of FIG. 8 may comprise a generalized representation of any or all of the fabrication procedures depicted in FIGS. 3, 5, and 7 according to some embodiments. The fabrication procedure of FIG. 8 may include an LDI fabrication stage and a post-processing stage. During the LDI fabrication stage, a conductive structure 806 may be fabricated on an LDI PCB 850 according to an LDI fabrication process. Conductive structure 806 may generally be comprised of conductive material, such as copper or any other suitable conductive material. In various embodiments, the fabrication of conductive structure 806 according to the LDI fabrication process may comprise implementing a minimum trace width based on an LDI minimum trace width requirement. In some such embodiments, the minimum trace width may comprise approximately 100 µm (or approximately 4 mils). In various embodiments, the fabrication of conductive structure 806 according to the LDI fabrication process may comprise implementing a minimum trace spacing based on an LDI minimum trace spacing requirement. In some such embodiments, the minimum trace spacing may comprise approximately 100 µm (or approximately 4 mils). In various embodiments, conductive structure 806 may be fabricated by chemical etching. In some embodiments, conductive structure 806 may be fabricated by laser milling or laser drilling. The embodiments are not limited in this context.

During the post-processing stage, one or more fine conductive features may be formed on LDI PCB 850 by performing an FFF process. In various embodiments, the FFF process may comprise removing conductive material of conductive structure 806 to form a fine gap region 808 within conductive structure 806. In some embodiments, the FFF process may comprise forming fine gap region 808 by removing conductive material of conductive structure 806 along an excision path 812. In various embodiments, fine gap region 808 may comprise a width of approximately 20-30 µm. In some embodiments, fine gap region 808 may comprise a width of approximately 50 µm or less. In various embodiments, an excision device 814 may be used to remove conductive material from conductive structure 806 to form fine gap region 808 during the post-processing stage. In some embodiments, the excision device 814 may be conveyed along excision path 812, and may create fine gap region 808 by removing conductive material as it traverses excision path 812. In various other embodiments, excision device 814 may remove conductive material along excision path 812 to form fine gap region 808 without traversing excision path 812. As such, it is to be appreciated that with respect to any given excision path such as excision path 812, the term "path" is not intended to necessarily denote a path of motion of an excision device such as excision device 814 or a path of motion of any other device or component. The embodiments are not limited in this context.

In some embodiments, the one or more fine conductive features formed during the post-processing stage may comprise breakout tracks for a connection array on LDI PCB 850. In various such embodiments, the connection array may comprise an inter-element pitch of approximately 0.8 mm. In other such embodiments, the connection array may comprise an inter-element pitch of approximately 1.0 mm. In some embodiments, the one or more fine conductive features formed during the post-processing stage may comprise an inductor coil. In various such embodiments, the inductor coil may comprise a multi-turn inductor coil. In some embodiments, the one or more fine conductive features formed during the post-processing stage may comprise a crosstalk mitigation structure. In various such embodiments, the crosstalk mitigation structure may be used for far-end crosstalk mitigation. The embodiments are not limited to these examples.

In some embodiments, excision device 814 may comprise a laser device that is used to remove conductive material from conductive structure 806 by laser ablation. In various embodiments, such laser ablation may be performed using a focused-beam laser ablation process. In some such embodiments, excision device 814 may be implemented using a diode pumped solid state (DPSS) laser system, such as a neodymium-doped yttrium aluminum garnet (Nd:YAG) DPSS laser system. In various embodiments, according to the focused-beam laser ablation process, LDI PCB 850 may be coated or sprayed with a protective material to form a thin protective layer to avoid/minimize potential surface contamination caused by laser ablation-generated debris. In some embodiments, a pulsed laser beam may then be focused onto the surface of LDI PCB 850 and steered along excision path 812. In various embodiments, the pulsed laser beam may be steered using a set of scanning galvanometer mirrors. In some, the focused-beam laser ablation process may use a pulsed laser featuring approximately a nanosecond pulse width. In various embodiments, the focused-beam laser ablation process may use a laser comprising light of a wavelength of approximately 355 nm. The embodiments are not limited in this context.

In some embodiments, a broad-beam laser ablation process may be used to form fine gap region 808. In various such embodiments, excision device 814 may be implemented using an excimer laser. In some embodiments, according to the broad-beam laser ablation process, a broad laser beam may be projected through a mask in order to remove conductive material from conductive structure 806 and thereby form fine gap region 808. In various embodiments, the mask may comprise a stainless-steel mask or an aluminum mask. In some embodiments, the mask may comprise a projection mask. In various other embodiments, the mask may comprise a contact mask. In some, the broad-beam laser ablation process may use a laser featuring approximately a nanosecond pulse width. In various embodiments, the broad-beam laser ablation process may use a beam comprising light of a wavelength of approximately 193-351 nm. In some embodiments in which a broad-beam laser ablation process is used, excision device 814 may not traverse excision path 812 in conjunction with forming fine gap region 808. The embodiments are not limited in this context.

Operations for the above embodiments may be further described with reference to the following figures and accompanying examples. Some of the figures may include a process flow. Although such figures presented herein may include a particular process flow, it can be appreciated that the process flow merely provides an example of how one or more techniques described herein may be implemented. Any particular such process flow may be implemented using one or more hardware elements, one or more software elements executed by a processor, or any combination thereof. The embodiments are not limited in this context.

Figure 9:
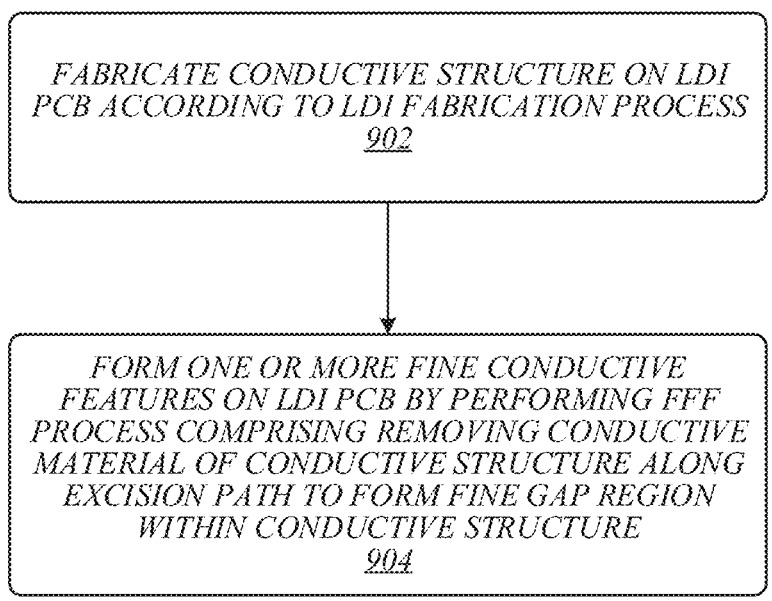
FIG. 9 illustrates an embodiment of a first process flow.

FIG. 9 illustrates an example of a process flow 900 that may be representative of the implementation of one or more of the disclosed FFF techniques according to various embodiments. For example, process flow 900 may be representative of an implementation of the fabrication procedure of FIG. 8 according to some embodiments. As shown in FIG. 9, a conductive structure may be fabricated on an LDI PCB at 902 according to an LDI fabrication process. For example, conductive structure 806 of FIG. 8 may be fabricated on LDI PCB 850 according to an LDI fabrication process. At 904, one or more fine conductive features may be formed on the LDI PCB by performing an FFF process comprising removing conductive material of the conductive structure along an excision path to form a fine gap region within the conductive structure. For example, one or more fine conductive features may be formed on LDI PCB 850 of FIG. 8 by performing an FFF process comprising using excision device 814 to remove conductive material of conductive structure 806 along excision path 812 to form fine gap region 808. The embodiments are not limited to these examples.

Figure 10:
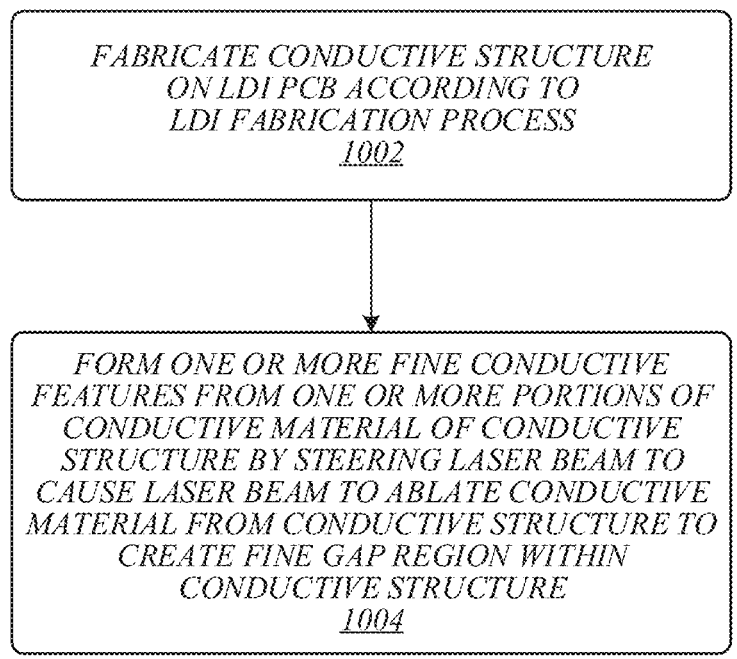
FIG. 10 illustrates an embodiment of a second process flow.

FIG. 10 illustrates an example of a process flow 1000 that may be representative of the implementation of one or more of the disclosed techniques according to various embodiments. For example, process flow 1000 may be representative of an implementation of the fabrication procedure of FIG. 8 according to some embodiments. As shown in FIG. 10, a conductive structure may be fabricated on an LDI PCB at 1002 according to an LDI fabrication process. For example, conductive structure 806 of FIG. 8 may be fabricated on LDI PCB 850 according to an LDI fabrication process. At 1004, one or more fine conductive features may be formed from one or more portions of conductive material of the conductive structure by steering a laser beam to cause the laser beam to ablate conductive material from the conductive structure to create a fine gap region within the conductive structure. For example, one or more fine conductive features may be formed from one or more portions of conductive material of conductive structure 806 of FIG. 8 by steering a laser beam generated by excision device 814 to cause the laser beam to ablate conductive material from conductive structure 806 to create fine gap region 808. The embodiments are not limited to these examples.

Figure 11:
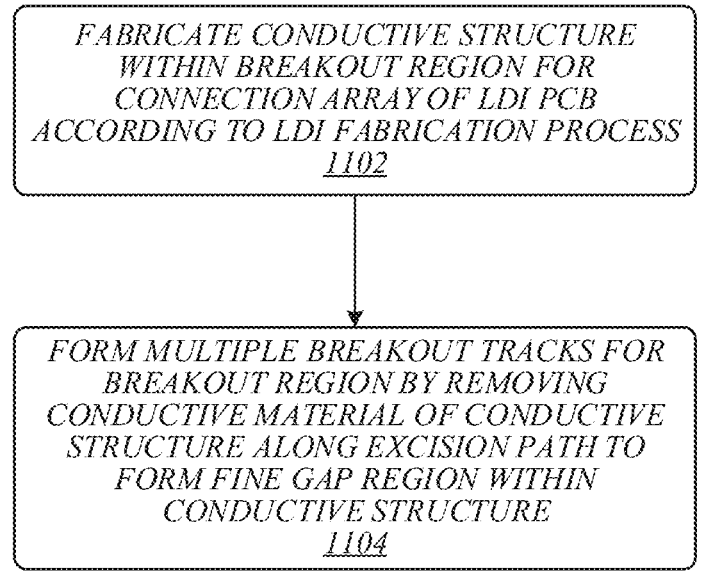
FIG. 11 illustrates an embodiment of a third process flow.

FIG. 11 illustrates an example of a process flow 1100 that may be representative of the implementation of one or more of the disclosed techniques according to various embodiments. For example, process flow 1100 may be representative of an implementation of the fabrication procedure of FIG. 8 according to some embodiments. As shown in FIG. 11, a conductive structure may be fabricated within a breakout region for a connection array of an LDI PCB according to an LDI fabrication process at 1102. For example, conductive structure 306 of FIG. 3 may be fabricated within a breakout region for connection array 200 of LDI PCB 150 according to an LDI fabrication process. At 1104, multiple breakout tracks may be formed for the breakout region by removing conductive material of the conductive structure along an excision path to form a fine gap region within the conductive structure. For example, conductive material may be removed from conductive structure 306 of FIG. 3 along an excision path to form fine gap region 308 within conductive structure 306, thereby forming breakout tracks 104-1 and 104-2 for the breakout region of connection array 200. The embodiments are not limited to these examples.

Figure 12:
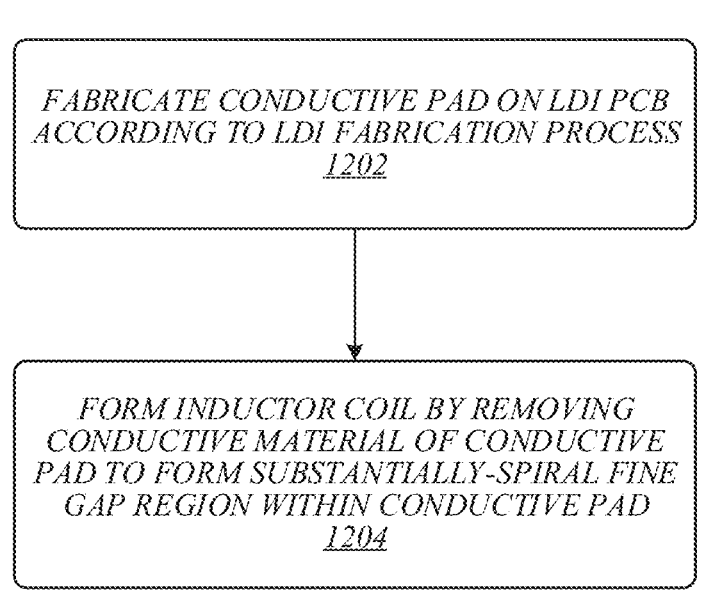
FIG. 12 illustrates an embodiment of a fourth process flow.

FIG. 12 illustrates an example of a process flow 1200 that may be representative of the implementation of one or more of the disclosed techniques according to various embodiments. For example, process flow 1200 may be representative of an implementation of the fabrication procedure of FIG. 8 according to some embodiments. As shown in FIG. 12, a conductive pad may be fabricated on an LDI PCB according to an LDI fabrication process at 1202. For example, a conductive pad may be fabricated as conductive structure 506 of FIG. 5 on LDI PCB 450. At 1204, an inductor coil may be formed by removing conductive material of the conductive pad to form a substantially-spiral fine gap region within the conductive pad. For example, after a conductive pad is fabricated as conductive structure 506 of FIG. 5, an inductor coil may be formed by removing conductive material of conductive structure 506 to form substantially-spiral fine gap region 508 within conductive structure 506. The embodiments are not limited to these examples.

Figure 13:
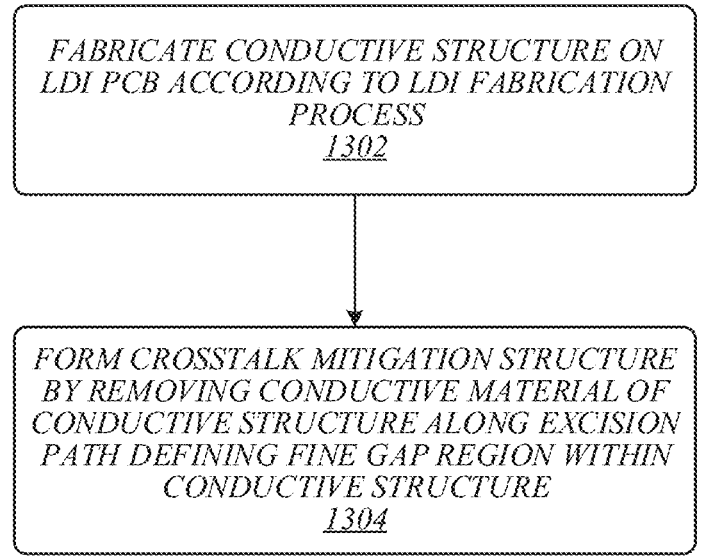
FIG. 13 illustrates an embodiment of a fifth process flow.

FIG. 13 illustrates an example of a process flow 1300 that may be representative of the implementation of one or more of the disclosed techniques according to various embodiments. For example, process flow 1300 may be representative of an implementation of the fabrication procedure of FIG. 8 according to some embodiments. As shown in FIG. 13, a conductive structure may be fabricated on an LDI PCB according to an LDI fabrication process at 1302. For example, conductive structure 706 of FIG. 7 may be fabricated on LDI PCB 650 according to an LDI fabrication process. At 1304, a crosstalk mitigation structure may be formed by removing conductive material of the conductive structure along an excision path defining a fine gap region within the conductive structure. For example, conductive material of conductive structure 706 of FIG. 7 may be removed along an excision path defining fine gap region 708 in order to form a crosstalk mitigation structure. The embodiments are not limited to these examples.

Figure 14:
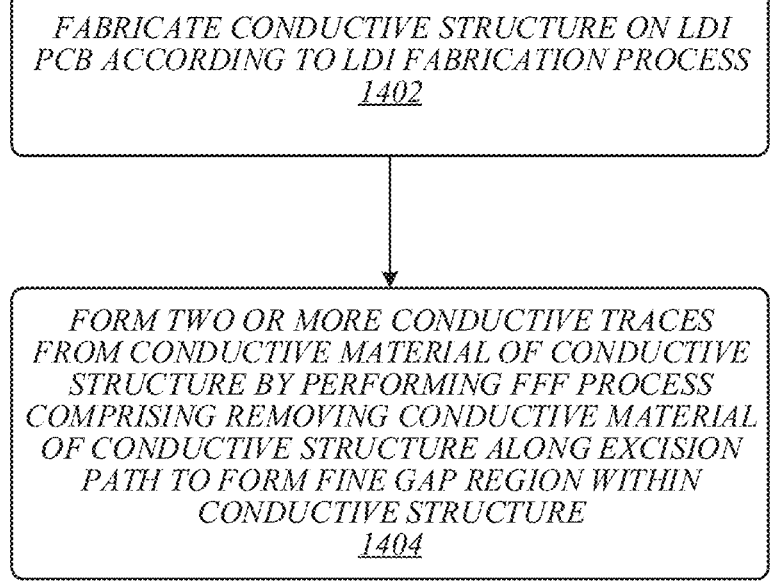
FIG. 14 illustrates an embodiment of a sixth process flow.

FIG. 14 illustrates an example of a process flow 1400 that may be representative of the implementation of one or more of the disclosed techniques according to various embodiments. For example, process flow 1400 may be representative of an implementation of the fabrication procedure of FIG. 8 according to some embodiments. As shown in FIG. 14, a conductive structure may be fabricated on an LDI PCB at 1402 according to an LDI fabrication process. For example, conductive structure 806 of FIG. 8 may be fabricated on LDI PCB 850 according to an LDI fabrication process. At 1404, two or more conductive traces may be formed from conductive material of the conductive structure by performing an FFF process comprising removing conductive material of the conductive structure along an excision path to form a fine gap region within the conductive structure. For example, two or more conductive traces may be formed from conductive material of conductive structure 806 of FIG. 8 by performing an FFF process comprising removing conductive material of conductive structure 806 along excision path 812 to form fine gap region 808. The embodiments are not limited to these examples.

Figure 15:
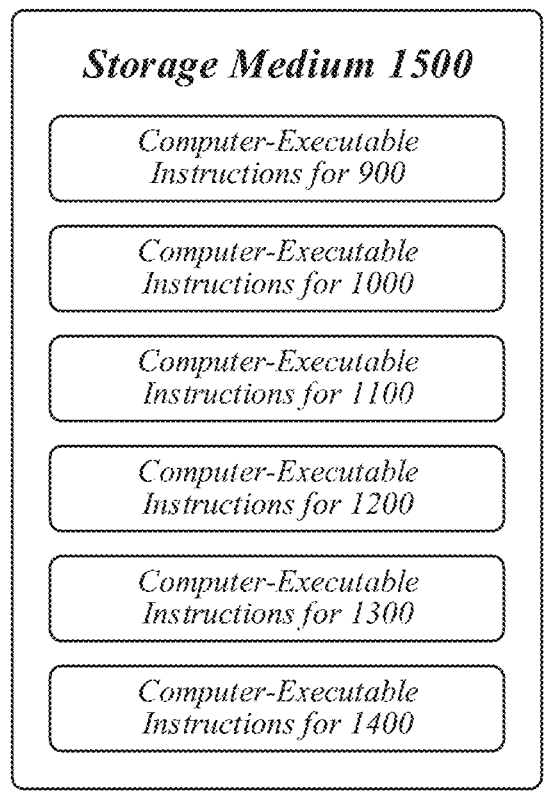
FIG. 15 illustrates an embodiment of a storage medium.

FIG. 15 illustrates an embodiment of a storage medium 1500. Storage medium 1500 may comprise any computer-readable storage medium or machine-readable storage medium, such as an optical, magnetic or semiconductor storage medium. In various embodiments, storage medium 1500 may comprise an article of manufacture. In some embodiments, storage medium 1500 may comprise a non-transitory storage medium. In some embodiments, storage medium 1500 may store computer-executable instructions, such as computer-executable instructions to implement one or more of process flow 900 of FIG. 9, process flow 1000 of FIG. 10, process m flow 1100 of FIG. 11, process flow 1200 of FIG. 12, process flow 1300 of FIG. 13, and process flow 1400 of FIG. 14. Examples of a computer-readable storage medium or machine-readable storage medium may include any tangible media capable of storing electronic data, including volatile memory or non-volatile memory, removable or non-removable memory, erasable or non-erasable memory, writeable or re-writeable memory, and so forth. Examples of computer-executable instructions may include any suitable type of code, such as source code, compiled code, interpreted code, executable code, static code, dynamic code, object-oriented code, visual code, and the like. The embodiments are not limited in this context.

Figure 16:
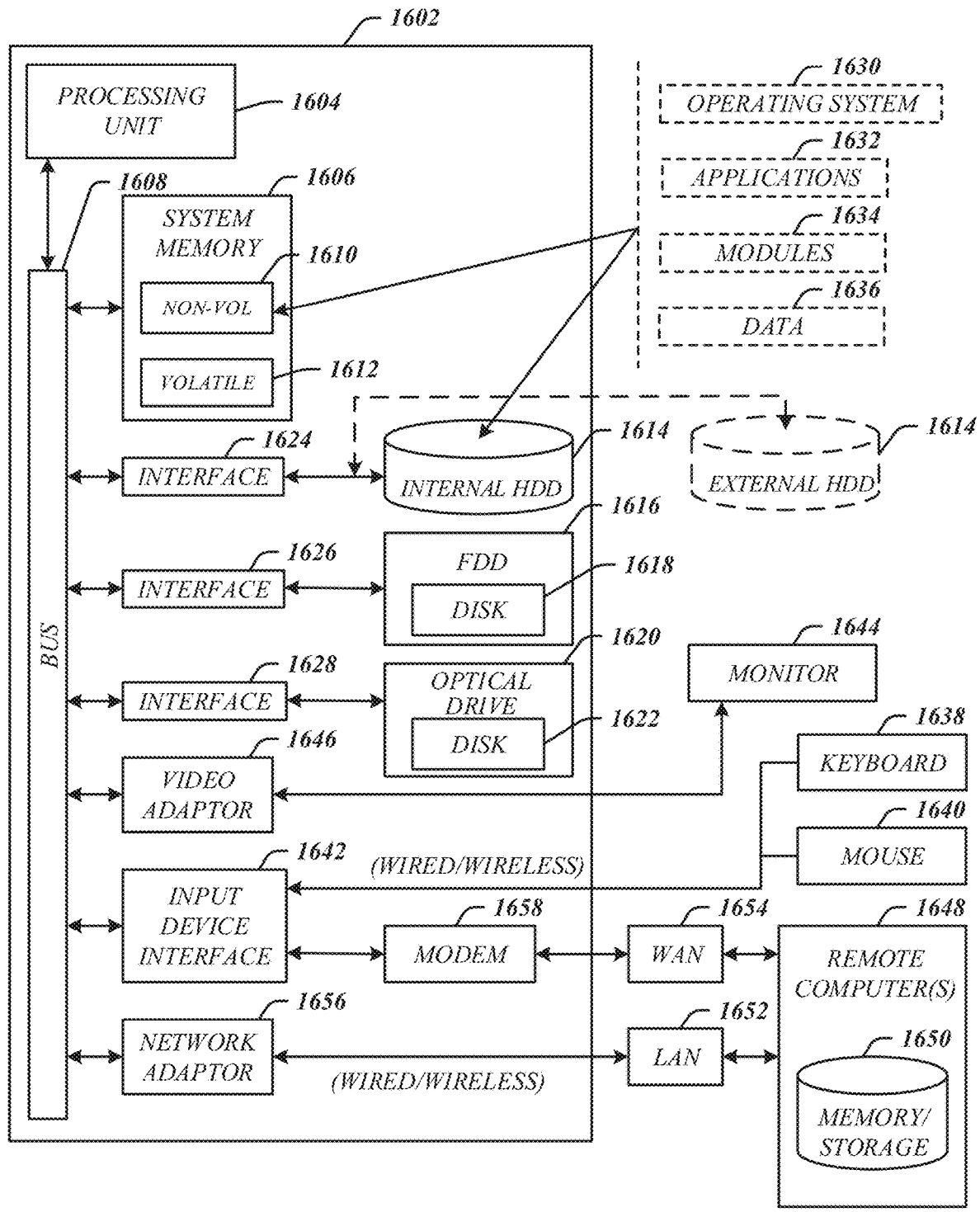
FIG. 16 illustrates an embodiment of a computing architecture.

FIG. 16 illustrates an embodiment of an exemplary computing architecture 1600 that may be suitable for implementing various embodiments as previously described. In various embodiments, the computing architecture 1600 may comprise or be implemented as part of an electronic device. In some embodiments, the computing architecture 1600 may be representative of a computing device that comprises a PCB featuring one or more fine features formed according to one or more of the disclosed techniques, such as one or more of process flow 900 of FIG. 9, process flow 1000 of FIG. 10, process flow 1100 of FIG. 11, process flow 1200 of FIG. 12, process flow 1300 of FIG. 13, and process flow 1400 of FIG. 14. The embodiments are not limited in this context.

As used in this application, the terms "system" and "component" and "module" are intended to refer to a computer-related entity, either hardware, a combination of hardware and software, software, or software in execution, examples of which are provided by the exemplary computing architecture 1600. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components can reside within a process and/or thread of execution, and a component can be localized on one computer and/or distributed between two or more computers. Further, components may be communicatively coupled to each other by various types of communications media to coordinate operations. The coordination may involve the uni-directional or bi-directional exchange of information. For instance, the components may communicate information in the form of signals communicated over the communications media. The information can be implemented as signals allocated to various signal lines. In such allocations, each message is a signal. Further embodiments, however, may alternatively employ data messages. Such data messages may be sent across various connections. Exemplary connections include parallel interfaces, serial interfaces, and bus interfaces.

The computing architecture 1600 includes various common computing elements, such as one or more processors, multi-core processors, co-processors, memory units, chipsets, controllers, peripherals, interfaces, oscillators, timing devices, video cards, audio cards, multimedia input/output (I/O) components, power supplies, and so forth. The embodiments, however, are not limited to implementation by the computing architecture 1600.

As shown in FIG. 16, according to computing architecture 1600, a computer 1602 comprises a processing unit 1604, a system memory 1606 and a system bus 1608. In some embodiments, computer 1602 may comprise a server. In some embodiments, computer 1602 may comprise a client. The processing unit 1604 can be any of various commercially available processors, including without limitation an AMD® Athlon®, Duron® and Opteron® processors; ARM® application, embedded and secure processors; IBM® and Motorola® DragonBall® and PowerPC® processors; IBM and Sony® Cell processors; Intel® Celeron®, Core (2) Duo®, Itanium®, Pentium®, Xeon®, and XScale® processors; and similar processors. Dual microprocessors, multi-core processors, and other multi-processor architectures may also be employed as the processing unit 1604.

The system bus 1608 provides an interface for system components including, but not limited to, the system memory 1606 to the processing unit 1604. The system bus 1608 can be any of several types of bus structure that may further interconnect to a memory bus (with or without a memory controller), a peripheral bus, and a local bus using any of a variety of commercially available bus architectures. Interface adapters may connect to the system bus 1608 via a slot architecture. Example slot architectures may include without limitation Accelerated Graphics Port (AGP), Card Bus, (Extended) Industry Standard Architecture ((E)ISA), Micro Channel Architecture (MCA), NuBus, Peripheral Component Interconnect (Extended) (PCI(X)), PCI Express, Personal Computer Memory Card International Association (PCMCIA), and the like.

The system memory 1606 may include various types of computer-readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory, solid state drives (SSD) and any other type of storage media suitable for storing information. In the illustrated embodiment shown in FIG. 16, the system memory 1606 can include non-volatile memory 1610 and/or volatile memory 1612. A basic input/output system (BIOS) can be stored in the non-volatile memory 1610.

The computer 1602 may include various types of computer-readable storage media in the form of one or more lower speed memory units, including an internal (or external) hard disk drive (HDD) 1614, a magnetic floppy disk drive (FDD) 1616 to read from or write to a removable magnetic disk 1618, and an optical disk drive 1620 to read from or write to a removable optical disk 1622 (e.g., a CD-ROM or DVD). The HDD 1614, FDD 1616 and optical disk drive 1620 can be connected to the system bus 1608 by a HDD interface 1624, an FDD interface 1626 and an optical drive interface 1628, respectively. The HDD interface 1624 for external drive implementations can include at least one or both of Universal Serial Bus (USB) and IEEE 1394 interface technologies.

The drives and associated computer-readable media provide volatile and/or nonvolatile storage of data, data structures, computer-executable instructions, and so forth. For example, a number of program modules can be stored in the drives and memory units 1610, 1612, including an operating system 1630, one or more application programs 1632, other program modules 1634, and program data 1636.

A user can enter commands and information into the computer 1602 through one or more wire/wireless input devices, for example, a keyboard 1638 and a pointing device, such as a mouse 1640. Other input devices may include microphones, infra-red (IR) remote controls, radio-frequency (RF) remote controls, game pads, stylus pens, card readers, dongles, finger print readers, gloves, graphics tablets, joysticks, keyboards, retina readers, touch screens (e.g., capacitive, resistive, etc.), trackballs, trackpads, sensors, styluses, and the like. These and other input devices are often connected to the processing unit 1604 through an input device interface 1642 that is coupled to the system bus 1608, but can be connected by other interfaces such as a parallel port, IEEE 1394 serial port, a game port, a USB port, an IR interface, and so forth.

A monitor 1644 or other type of display device is also connected to the system bus 1608 via an interface, such as a video adaptor 1646. The monitor 1644 may be internal or external to the computer 1602. In addition to the monitor 1644, a computer typically includes other peripheral output devices, such as speakers, printers, and so forth.

The computer 1602 may operate in a networked environment using logical connections via wire and/or wireless communications to one or more remote computers, such as a remote computer 1648. The remote computer 1648 can be a workstation, a server computer, a router, a personal computer, portable computer, microprocessor-based entertainment appliance, a peer device or other common network node, and typically includes many or all of the elements described relative to the computer 1602, although, for purposes of brevity, only a memory/storage device 1650 is illustrated. The logical connections depicted include wire/wireless connectivity to a local area network (LAN) 1652 and/or larger networks, for example, a wide area network (WAN) 1654. Such LAN and WAN networking environments are commonplace in offices and companies, and facilitate enterprise-wide computer networks, such as intranets, all of which may connect to a global communications network, for example, the Internet.

When used in a LAN networking environment, the computer 1602 is connected to the LAN 1652 through a wire and/or wireless communication network interface or adaptor 1656. The adaptor 1656 can facilitate wire and/or wireless communications to the LAN 1652, which may also include a wireless access point disposed thereon for communicating with the wireless functionality of the adaptor 1656.

When used in a WAN networking environment, the computer 1602 can include a modem 1658, or is connected to a communications server on the WAN 1654, or has other means for establishing communications over the WAN 1654, such as by way of the Internet. The modem 1658, which can be internal or external and a wire and/or wireless device, connects to the system bus 1608 via the input device interface 1642. In a networked environment, program modules depicted relative to the computer 1602, or portions thereof, can be stored in the remote memory/storage device 1650. It will be appreciated that the network connections shown are exemplary and other means of establishing a communications link between the computers can be used.

The computer 1602 is operable to communicate with wire and wireless devices or entities using the IEEE 802 family of standards, such as wireless devices operatively disposed in wireless communication (e.g., IEEE 802.16 over-the-air modulation techniques). This includes at least Wi-Fi (or Wireless Fidelity), WiMax, and Bluetooth™ wireless technologies, among others. Thus, the communication can be a predefined structure as with a conventional network or simply an ad hoc communication between at least two devices. Wi-Fi networks use radio technologies called IEEE 802.11x (a, b, g, n, etc.) to provide secure, reliable, fast wireless connectivity. A Wi-Fi network can be used to connect computers to each other, to the Internet, and to wire networks (which use IEEE 802.3-related media and functions).

Figure 17:
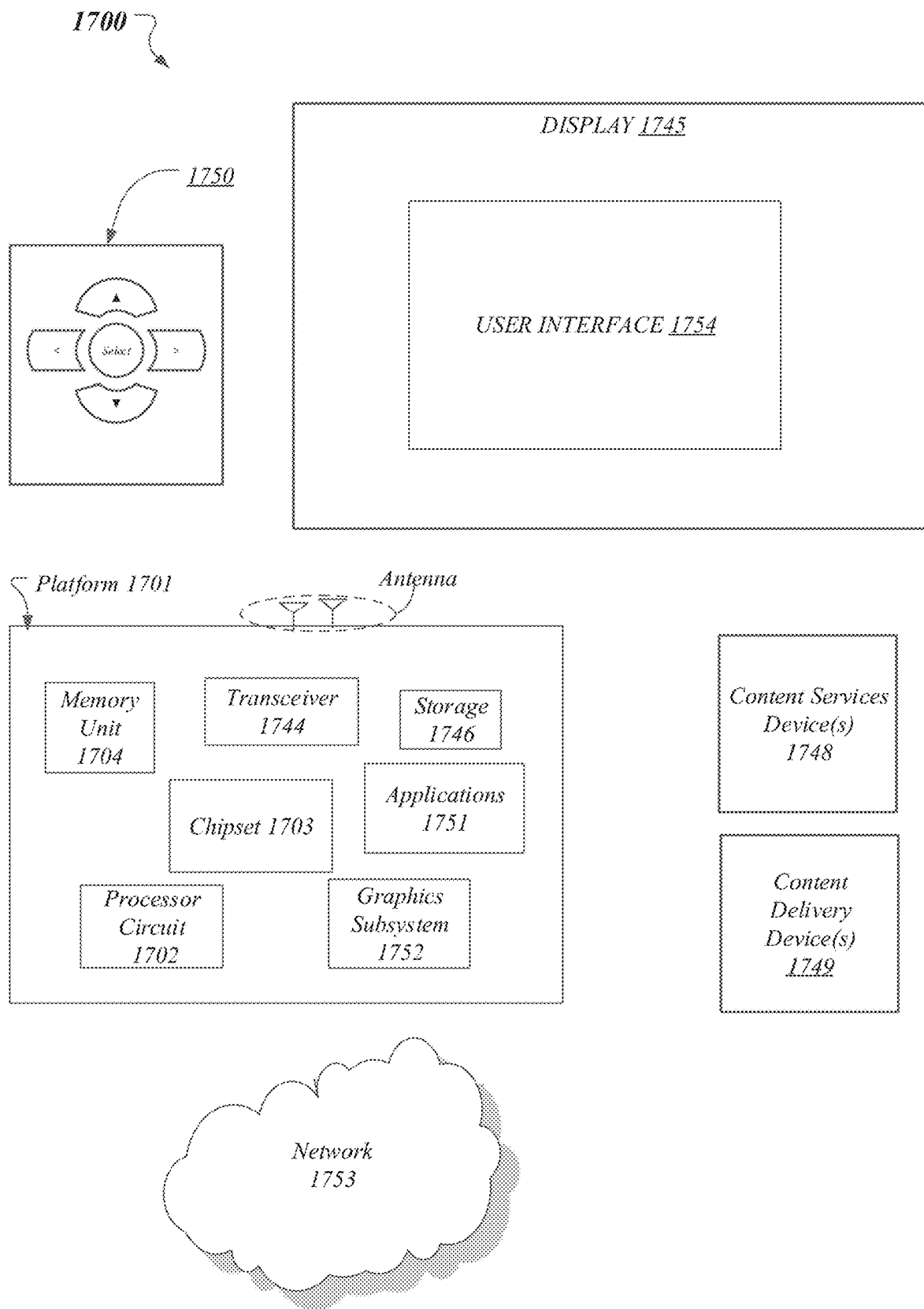
FIG. 17 illustrates an embodiment of a system.

FIG. 17 illustrates an embodiment of a system 1700. In various embodiments, system 1700 may be representative of a system or architecture that is realized according to one or more techniques described herein, such as one or more of process flow 900 of FIG. 9, process flow 1000 of FIG. 10, process flow 1100 of FIG. 11, process flow 1200 of FIG. 12, process flow 1300 of FIG. 13, and process flow 1400 of FIG. 14, storage medium 1500 of FIG. 15, and computing architecture 1600 of FIG. 16. The embodiments are not limited in this respect.

As shown in FIG. 17, system 1700 may include multiple elements. One or more elements may be implemented using one or more circuits, components, registers, processors, software subroutines, modules, or any combination thereof, as desired for a given set of design or performance constraints. Although FIG. 17 shows a limited number of elements in a certain topology by way of example, it can be appreciated that more or less elements in any suitable topology may be used in system 1700 as desired for a given implementation. The embodiments are not limited in this context.

In embodiments, system 1700 may be a media system although system 1700 is not limited to this context. For example, system 1700 may be incorporated into a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

In embodiments, system 1700 includes a platform 1701 coupled to a display 1745. Platform 1701 may receive content from a content device such as content services device(s) 1748 or content delivery device(s) 1749 or other similar content sources. A navigation controller 1750 including one or more navigation features may be used to interact with, for example, platform 1701 and/or display 1745. Each of these components is described in more detail below.

In embodiments, platform 1701 may include any combination of a processor circuit 1702, chipset 1703, memory unit 1704, transceiver 1744, storage 1746, applications 1751, and/or graphics subsystem 1752. Chipset 1703 may provide intercommunication among processor circuit 1702, memory unit 1704, transceiver 1744, storage 1746, applications 1751, and/or graphics subsystem 1752. For example, chipset 1703 may include a storage adapter (not depicted) capable of providing intercommunication with storage 1746.

Processor circuit 1702 may be implemented using any processor or logic device, and may be the same as or similar to processing unit 1604 of FIG. 16. Memory unit 1704 may be implemented using any machine-readable or computer-readable media capable of storing data, and may be the same as or similar to system memory 1606 of FIG. 16. Transceiver 1744 may include one or more radios capable of transmitting and receiving signals using various suitable wireless communications techniques. Display 1745 may include any television type monitor or display, and may be the same as or similar to monitor 1644 of FIG. 16. Storage 1746 may be implemented as a non-volatile storage device, and may be the same as or similar to HDD 1614 of FIG. 16.

Graphics subsystem 1752 may perform processing of images such as still or video for display. Graphics subsystem 1752 may be a graphics processing unit (GPU) or a visual processing unit (VPU), for example. An analog or digital interface may be used to communicatively couple graphics subsystem 1752 and display 1745. For example, the interface may be any of a High-Definition Multimedia Interface, DisplayPort, wireless HDMI, and/or wireless HD compliant techniques. Graphics subsystem 1752 could be integrated into processor circuit 1702 or chipset 1703. Graphics subsystem 1752 could be a stand-alone card communicatively coupled to chipset 1703.

The graphics and/or video processing techniques described herein may be implemented in various hardware architectures. For example, graphics and/or video functionality may be integrated within a chipset. Alternatively, a discrete graphics and/or video processor may be used. As still another embodiment, the graphics and/or video functions may be implemented by a general purpose processor, including a multi-core processor. In a further embodiment, the functions may be implemented in a consumer electronics device.

In embodiments, content services device(s) 1748 may be hosted by any national, international and/or independent service and thus accessible to platform 1701 via the Internet, for example. Content services device(s) 1748 may be coupled to platform 1701 and/or to display 1745. Platform 1701 and/or content services device(s) 1748 may be coupled to a network 1753 to communicate (e.g., send and/or receive) media information to and from network 1753. Content delivery device(s) 1749 also may be coupled to platform 1701 and/or to display 1745.

In embodiments, content services device(s) 1748 may include a cable television box, personal computer, network, telephone, Internet enabled devices or appliance capable of delivering digital information and/or content, and any other similar device capable of unidirectionally or bidirectionally communicating content between content providers and platform 1701 and/display 1745, via network 1753 or directly. It will be appreciated that the content may be communicated unidirectionally and/or bidirectionally to and from any one of the components in system 1700 and a content provider via network 1753. Examples of content may include any media information including, for example, video, music, medical and gaming information, and so forth.

Content services device(s) 1748 receives content such as cable television programming including media information, digital information, and/or other content. Examples of content providers may include any cable or satellite television or radio or Internet content providers. The provided examples are not meant to limit embodiments of the disclosed subject matter.

In embodiments, platform 1701 may receive control signals from navigation controller 1750 having one or more navigation features. The navigation features of navigation controller 1750 may be used to interact with a user interface 1754, for example. In embodiments, navigation controller 1750 may be a pointing device that may be a computer hardware component (specifically human interface device) that allows a user to input spatial (e.g., continuous and multi-dimensional) data into a computer. Many systems such as graphical user interfaces (GUI), and televisions and monitors allow the user to control and provide data to the computer or television using physical gestures.

Movements of the navigation features of navigation controller 1750 may be echoed on a display (e.g., display 1745) by movements of a pointer, cursor, focus ring, or other visual indicators displayed on the display. For example, under the control of software applications 1751, the navigation features located on navigation controller 1750 may be mapped to virtual navigation features displayed on user interface 1754. In embodiments, navigation controller 1750 may not be a separate component but integrated into platform 1701 and/or display 1745. Embodiments, however, are not limited to the elements or in the context shown or described herein.

In embodiments, drivers (not shown) may include technology to enable users to instantly turn on and off platform 1701 like a television with the touch of a button after initial boot-up, when enabled, for example. Program logic may allow platform 1701 to stream content to media adaptors or other content services device(s) 1748 or content delivery device(s) 1749 when the platform is turned "off." In addition, chip set 1703 may include hardware and/or software support for 5.1 surround sound audio and/or high definition 7.1 surround sound audio, for example. Drivers may include a graphics driver for integrated graphics platforms. In embodiments, the graphics driver may include a peripheral component interconnect (PCI) Express graphics card.

In various embodiments, any one or more of the components shown in system 1700 may be integrated. For example, platform 1701 and content services device(s) 1748 may be integrated, or platform 1701 and content delivery device(s) 1749 may be integrated, or platform 1701, content services device(s) 1748, and content delivery device(s) 1749 may be integrated, for example. In various embodiments, platform 1701 and display 1745 may be an integrated unit. Display 1745 and content service device(s) 1748 may be integrated, or display 1745 and content delivery device(s) 1749 may be integrated, for example. These examples are not meant to limit the disclosed subject matter.

In various embodiments, system 1700 may be implemented as a wireless system, a wired system, or a combination of both. When implemented as a wireless system, system 1700 may include components and interfaces suitable for communicating over a wireless shared media, such as one or more antennas, transmitters, receivers, transceivers, amplifiers, filters, control logic, and so forth. An example of wireless shared media may include portions of a wireless spectrum, such as the RF spectrum and so forth. When implemented as a wired system, system 1700 may include components and interfaces suitable for communicating over wired communications media, such as I/O adapters, physical connectors to connect the I/O adapter with a corresponding wired communications medium, a network interface card (NIC), disc controller, video controller, audio controller, and so forth. Examples of wired communications media may include a wire, cable, metal leads, printed circuit board (PCB), backplane, switch fabric, semiconductor material, twisted-pair wire, co-axial cable, fiber optics, and so forth.

Platform 1701 may establish one or more logical or physical channels to communicate information. The information may include media information and control information. Media information may refer to any data representing content meant for a user. Examples of content may include, for example, data from a voice conversation, videoconference, streaming video, electronic mail ("email") message, voice mail message, alphanumeric symbols, graphics, image, video, text and so forth. Data from a voice conversation may be, for example, speech information, silence periods, background noise, comfort noise, tones and so forth. Control information may refer to any data representing commands, instructions or control words meant for an automated system. For example, control information may be used to route media information through a system, or instruct a node to process the media information in a predetermined manner. The embodiments, however, are not limited to the elements or in the context shown or described in FIG. 17.

Figure 18:
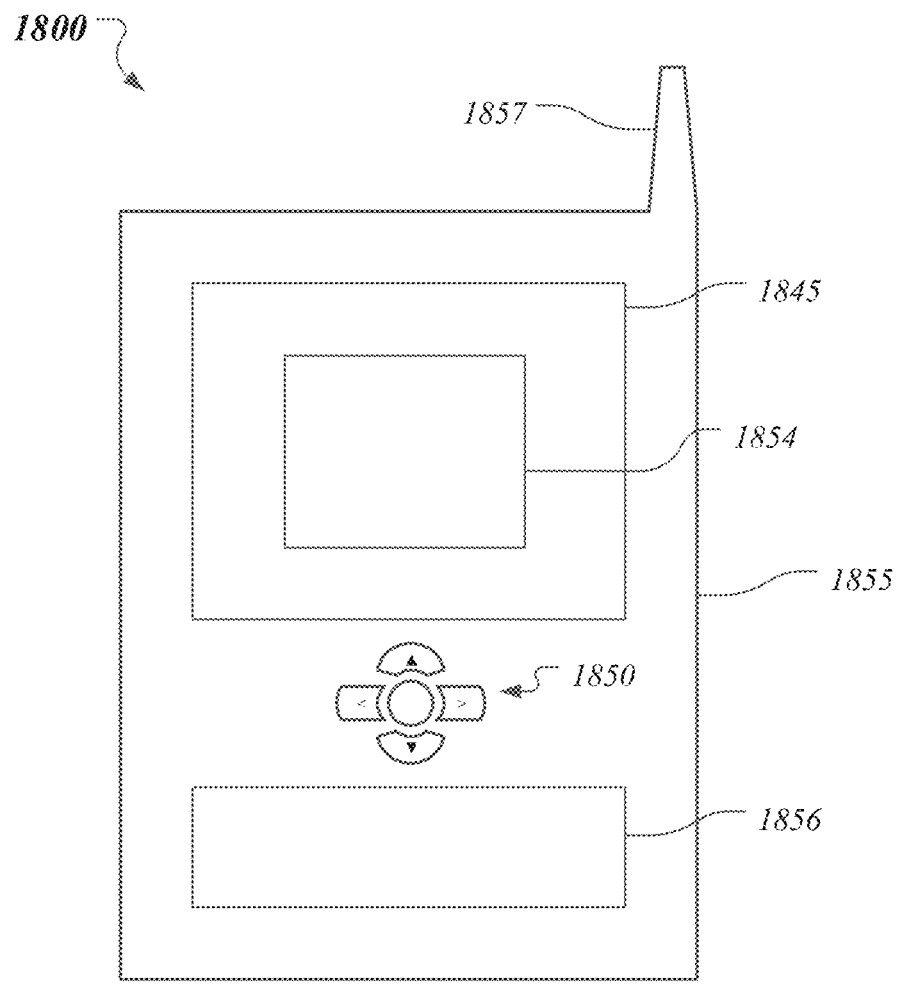
FIG. 18 illustrates an embodiment of a device.

As described above, system 1700 may be embodied in varying physical styles or form factors. FIG. 18 illustrates embodiments of a small form factor device 1800 in which system 1700 may be embodied. In embodiments, for example, device 1800 may be implemented as a mobile computing device having wireless capabilities. A mobile computing device may refer to any device having a processing system and a mobile power source or supply, such as one or more batteries, for example.

As described above, examples of a mobile computing device may include a personal computer (PC), laptop computer, ultra-laptop computer, tablet, touch pad, portable computer, handheld computer, palmtop computer, personal digital assistant (PDA), cellular telephone, combination cellular telephone/PDA, television, smart device (e.g., smart phone, smart tablet or smart television), mobile internet device (MID), messaging device, data communication device, and so forth.

Examples of a mobile computing device also may include computers that are arranged to be worn by a person, such as a wrist computer, finger computer, ring computer, eyeglass computer, belt-clip computer, arm-band computer, shoe computers, clothing computers, and other wearable computers. In embodiments, for example, a mobile computing device may be implemented as a smart phone capable of executing computer applications, as well as voice communications and/or data communications. Although some embodiments may be described with a mobile computing device implemented as a smart phone by way of example, it may be appreciated that other embodiments may be implemented using other wireless mobile computing devices as well. The embodiments are not limited in this context.

As shown in FIG. 18, device 1800 may include a display 1845, a navigation controller 1850, a user interface 1854, a housing 1855, an I/O device 1856, and an antenna 1857. Display 1845 may include any suitable display unit for displaying information appropriate for a mobile computing device, and may be the same as or similar to display 1745 in FIG. 17. Navigation controller 1850 may include one or more navigation features which may be used to interact with user interface 1854, and may be the same as or similar to navigation controller 1750 in FIG. 17. I/O device 1856 may include any suitable I/O device for entering information into a mobile computing device. Examples for I/O device 1856 may include an alphanumeric keyboard, a numeric keypad, a touch pad, input keys, buttons, switches, rocker switches, microphones, speakers, voice recognition device and software, and so forth. Information also may be entered into device 1800 by way of microphone. Such information may be digitized by a voice recognition device. The embodiments are not limited in this context.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores"

may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following examples pertain to further embodiments:

Example 1 is a method, comprising fabricating a conductive structure on a low density interconnect (LDI) printed circuit board (PCB) according to an LDI fabrication process, and forming one or more fine conductive features on the LDI PCB by performing a fine feature formation (FFF) process, the FFF process to comprise removing conductive material of the conductive structure along an excision path to form a fine gap region within the conductive structure.

Example 2 is the method of Example 1, the fabrication of the conductive structure according to the LDI fabrication process to comprise implementing a minimum trace width based on an LDI minimum trace width requirement.

Example 3 is the method of Example 2, the minimum trace width comprising approximately 100 μm.

Example 4 is the method of any of Examples 1 to 3, the fabrication of the conductive structure according to the LDI fabrication process to comprise implementing a minimum trace spacing based on an LDI minimum trace spacing requirement.

Example 5 is the method of Example 4, the minimum trace spacing comprising approximately 100 μm.

Example 6 is the method of any of Examples 1 to 5, the fine gap region to comprise a width of approximately 20-30 μm.

Example 6.1 is the method of any of Examples 1 to 6, the fine gap region to comprise a width of approximately 50 μm or less.

Example 7 is the method of any of Examples 1 to 6.1, the FFF process to comprise removing the conductive material via a laser ablation process.

Example 8 is the method of Example 7, the laser ablation process to comprise a focused-beam laser ablation process.

Example 9 is the method of Example 8, the focused-beam laser ablation process to comprise removing the conductive material using a diode pumped solid state (DPSS) laser system.

Example 10 is the method of any of Examples 8 to 9, the focused-beam laser ablation process to comprise coating at least a portion of a surface of the LDI PCB with a protective material.

Example 11 is the method of any of Examples 8 to 10, the focused-beam laser ablation process to comprise focusing a pulsed laser beam.

Example 12 is the method of any of Examples 8 to 11, the focused-beam laser ablation process to comprise steering a focused laser beam using a set of scanning galvanometer mirrors.

Example 13 is the method of any of Examples 8 to 12, the focused-beam laser ablation process to comprise removing the conductive material using a laser comprising light of a wavelength of approximately 355 nm.

Example 14 is the method of Example 7, the laser ablation process to comprise a broad-beam laser ablation process.

Example 15 is the method of Example 14, the broad-beam laser ablation process to comprise removing the conductive material using an excimer laser.

Example 16 is the method of any of Examples 14 to 15, the broad-beam laser ablation process to comprise projecting a broad laser beam through a mask.

Example 17 is the method of any of Examples 14 to 16, the broad-beam laser ablation process to comprise removing the conductive material using a pulsed laser beam.

Example 18 is the method of any of Examples 14 to 17, the broad-beam laser ablation process to comprise removing the conductive material using a laser comprising light of a wavelength within a range of approximately 193-351 nm.

Example 19 is the method of any of Examples 1 to 18, the one or more fine conductive features to comprise breakout tracks for a connection array on the LDI PCB.

Example 20 is the method of Example 19, the connection array to comprise an inter-element pitch of approximately 0.8 mm.

Example 21 is the method of Example 19, the connection array to comprise an inter-element pitch of approximately 1.0 mm.

Example 22 is the method of any of Examples 1 to 18, the one or more fine conductive features to comprise an inductor coil.

Example 23 is the method of Example 22, the inductor coil to comprise a multi-turn inductor coil.

Example 24 is the method of any of Examples 1 to 18, the one or more fine conductive features to comprise a crosstalk mitigation structure.

Example 25 is the method of Example 24, the crosstalk mitigation structure to comprise a far-end crosstalk mitigation structure.

Example 26 is the method of any of Examples 1 to 25, comprising fabricating the conductive structure by chemical etching.

Example 27 is the method of any of Examples 1 to 25, comprising fabricating the conductive structure by laser milling or laser drilling.

Example 28 is at least one non-transitory machine-readable storage medium comprising a set of instructions that, in response to being executed by processing circuitry of a PCB fabrication system, cause the PCB fabrication system to perform a method according to any of Examples 1 to 27.

Example 29 is an apparatus, comprising means for performing a method according to any of Examples 1 to 27.

Example 30 is a method, comprising fabricating a conductive structure on a low density interconnect (LDI) printed circuit board (PCB) according to an LDI fabrication process, and performing a laser ablation process to use one or more portions of conductive material of the conductive structure to form one or more fine conductive features, the laser ablation process to comprise steering a laser beam to cause the laser beam to ablate conductive material from the conductive structure to create a fine gap region within the conductive structure.

Example 31 is the method of Example 30, the laser beam to create the fine gap region by ablating conductive material along an excision path corresponding to the fine gap region.

Example 32 is the method of any of Examples 30 to 31, the fabrication of the conductive structure according to the LDI fabrication process to comprise implementing a minimum trace width based on an LDI minimum trace width requirement.

Example 33 is the method of Example 32, the minimum trace width comprising approximately 100 μm.

Example 34 is the method of any of Examples 30 to 33, the fabrication of the conductive structure according to the LDI fabrication process to comprise implementing a minimum trace spacing based on an LDI minimum trace spacing requirement.

Example 35 is the method of Example 34, the minimum trace spacing comprising approximately 100 μm.

Example 36 is the method of any of Examples 30 to 35, the fine gap region to comprise a width of approximately 20-30 μm.

Example 36.1 is the method of any of Examples 30 to 36, the fine gap region to comprise a width of approximately 50 μm or less.

Example 37 is the method of any of Examples 30 to 36.1, the laser ablation process to comprise a focused-beam laser ablation process.

Example 38 is the method of Example 37, the focused-beam laser ablation process to comprise ablating the conductive material using a diode pumped solid state (DPSS) laser system.

Example 39 is the method of any of Examples 37 to 38, the focused-beam laser ablation process to comprise coating at least a portion of a surface of the LDI PCB with a protective material.

Example 40 is the method of any of Examples 37 to 39, the focused-beam laser ablation process to comprise focusing a pulsed laser beam.

Example 41 is the method of any of Examples 37 to 40, the focused-beam laser ablation process to comprise steering a focused laser beam using a set of scanning galvanometer mirrors.

Example 42 is the method of any of Examples 37 to 41, the focused-beam laser ablation process to comprise ablating the conductive material using a laser comprising light of a wavelength of approximately 355 nm.

Example 43 is the method of any of Examples 30 to 36, the laser ablation process to comprise a broad-beam laser ablation process.

Example 44 is the method of Example 43, the broad-beam laser ablation process to comprise ablating the conductive material using an excimer laser.

Example 45 is the method of any of Examples 43 to 44, the broad-beam laser ablation process to comprise projecting a broad laser beam through a mask.

Example 46 is the method of any of Examples 43 to 45, the broad-beam laser ablation process to comprise ablating the conductive material using a pulsed laser beam.

Example 47 is the method of any of Examples 43 to 46, the broad-beam laser ablation process to comprise ablating the conductive material using a laser comprising light of a wavelength within a range of approximately 193-351 nm.

Example 48 is the method of any of Examples 30 to 47, the one or more fine conductive features to comprise breakout tracks for a connection array on the LDI PCB.

Example 49 is the method of Example 48, the connection array to comprise an inter-element pitch of approximately 0.8 mm.

Example 50 is the method of Example 48, the connection array to comprise an inter-element pitch of approximately 1.0 mm.

Example 51 is the method of any of Examples 30 to 47, the one or more fine conductive features to comprise an inductor coil.

Example 52 is the method of Example 51, the inductor coil to comprise a multi-turn inductor coil.

Example 53 is the method of any of Examples 30 to 47, the one or more fine conductive features to comprise a crosstalk mitigation structure.

Example 54 is the method of Example 53, the crosstalk mitigation structure to comprise a far-end crosstalk mitigation structure.

Example 55 is the method of any of Examples 30 to 54, comprising fabricating the conductive structure by chemical etching.

Example 56 is the method of any of Examples 30 to 54, comprising fabricating the conductive structure by laser milling or laser drilling.

Example 57 is at least one non-transitory machine-readable storage medium comprising a set of instructions that, in response to being executed by processing circuitry of a PCB fabrication system, cause the PCB fabrication system to perform a method according to any of Examples 30 to 56.

Example 58 is an apparatus, comprising means for performing a method according to any of Examples 30 to 56.

Example 59 is a method, comprising fabricating a conductive structure on a low density interconnect (LDI) printed circuit board (PCB) according to an LDI fabrication process, and forming two or more conductive traces from conductive material of the conductive structure by performing a fine feature formation (FFF) process, the FFF process to comprise removing conductive material of the conductive structure along an excision path to form a fine gap region within the conductive structure.

Example 60 is the method of Example 59, the fabrication of the conductive structure according to the LDI fabrication process to comprise implementing a minimum trace width based on an LDI minimum trace width requirement.

Example 61 is the method of Example 60, the minimum trace width comprising approximately 100 μm.

Example 62 is the method of any of Examples 59 to 61, the fabrication of the conductive structure according to the LDI fabrication process to comprise implementing a minimum trace spacing based on an LDI minimum trace spacing requirement.

Example 63 is the method of Example 62, the minimum trace spacing comprising approximately 100 μm.

Example 64 is the method of any of Examples 59 to 63, the fine gap region to comprise a width of approximately 20-30 μm.

Example 64.1 is the method of any of Examples 59 to 64, the fine gap region to comprise a width of approximately 50 μm or less.

Example 65 is the method of any of Examples 59 to 64.1, the FFF process to comprise removing the conductive material via a laser ablation process.

Example 66 is the method of Example 65, the laser ablation process to comprise a focused-beam laser ablation process.

Example 67 is the method of Example 66, the focused-beam laser ablation process to comprise removing the conductive material using a diode pumped solid state (DPSS) laser system.

Example 68 is the method of any of Examples 66 to 67, the focused-beam laser ablation process to comprise coating at least a portion of a surface of the LDI PCB with a protective material.

Example 69 is the method of any of Examples 66 to 68, the focused-beam laser ablation process to comprise focusing a pulsed laser beam.

Example 70 is the method of any of Examples 66 to 69, the focused-beam laser ablation process to comprise steering a focused laser beam using a set of scanning galvanometer mirrors.

Example 71 is the method of any of Examples 66 to 70, the focused-beam laser ablation process to comprise removing the conductive material using a laser comprising light of a wavelength of approximately 355 nm.

Example 72 is the method of Example 65, the laser ablation process to comprise a broad-beam laser ablation process.

Example 73 is the method of Example 72, the broad-beam laser ablation process to comprise removing the conductive material using an excimer laser.

Example 74 is the method of any of Examples 72 to 73, the broad-beam laser ablation process to comprise projecting a broad laser beam through a mask.

Example 75 is the method of any of Examples 72 to 74, the broad-beam laser ablation process to comprise removing the conductive material using a pulsed laser beam.

Example 76 is the method of any of Examples 72 to 75, the broad-beam laser ablation process to comprise removing the conductive material using a laser comprising light of a wavelength within a range of approximately 193-351 nm.

Example 77 is the method of any of Examples 59 to 76, the two or more conductive traces to comprise breakout tracks for a connection array on the LDI PCB.

Example 78 is the method of Example 77, the connection array to comprise an inter-element pitch of approximately 0.8 mm.

Example 79 is the method of Example 77, the connection array to comprise an inter-element pitch of approximately 1.0 mm.

Example 80 is the method of any of Examples 59 to 76, comprising forming a crosstalk mitigation structure by performing the FFF process to form two conductive traces from conductive material of the conductive structure.

Example 81 is the method of Example 80, the crosstalk mitigation structure to comprise a far-end crosstalk mitigation structure.

Example 82 is the method of any of Examples 59 to 81, comprising fabricating the conductive structure by chemical etching.

Example 83 is the method of any of Examples 59 to 81, comprising fabricating the conductive structure by laser milling or laser drilling.

Example 84 is at least one non-transitory machine-readable storage medium comprising a set of instructions that, in response to being executed by processing circuitry of a PCB fabrication system, cause the PCB fabrication system to perform a method according to any of Examples 59 to 83.

Example 85 is an apparatus, comprising means for performing a method according to any of Examples 59 to 83.

Numerous specific details have been set forth herein to provide a thorough understanding of the embodiments. It will be understood by those skilled in the art, however, that the embodiments may be practiced without these specific details. In other instances, well-known operations, components, and circuits have not been described in detail so as not to obscure the embodiments. It can be appreciated that the specific structural and functional details disclosed herein may be representative and do not necessarily limit the scope of the embodiments.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still co-operate or interact with each other.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method, comprising:
fabricating a conductive structure on a low density interconnect (LDI) printed circuit board (PCB); and
forming one or more fine conductive features from the conductive structure on the LDI PCB by performing a fine feature formation (FFF) process, the FFF process to comprise removing conductive material of the conductive structure along an excision path to form a fine gap region within the conductive structure.

2. The method of claim 1, comprising implementing a minimum trace width of approximately 100 μm and a minimum trace spacing of approximately 100 μm.

3. The method of claim 1, the fine gap region to comprise a width of approximately 20-30 μm.

4. The method of claim 1, the fine gap region to comprise a width of approximately 50 μm or less.

5. The method of claim 1, the one or more fine conductive features to comprise breakout tracks for a connection array on the LDI PCB.

6. The method of claim 5, the connection array to comprise an inter-element pitch of approximately 0.8 mm.

7. The method of claim 1, the one or more fine conductive features to comprise an inductor coil.

8. The method of claim 1, the one or more fine conductive features to comprise a crosstalk mitigation structure.

9. The method of claim 1, the FFF process to comprise removing the conductive material via a laser ablation process.

10. A method, comprising:
fabricating a conductive structure on a low density interconnect (LDI) printed circuit board (PCB); and
performing a laser ablation process to use one or more portions of conductive material of the conductive structure to form one or more fine conductive features, the laser ablation process to comprise steering a laser beam to cause the laser beam to ablate conductive material from the conductive structure to create a fine gap region within the conductive structure.

11. The method of claim 10, the laser beam to create the fine gap region by ablating conductive material along an excision path corresponding to the fine gap region.

12. The method of claim 10, the fine gap region to comprise a width of approximately 20-30 μm.

13. The method of claim 10, the fine gap region to comprise a width of approximately 50 μm or less.

14. The method of claim 10, the laser ablation process to comprise a focused-beam laser ablation process.

15. The method of claim 14, the focused-beam laser ablation process to comprise ablating the conductive material using a diode pumped solid state (DPSS) laser system.

16. The method of claim 10, the laser ablation process to comprise a broad-beam laser ablation process.

17. The method of claim 16, the broad-beam laser ablation process to comprise projecting the laser beam through a mask.

18. A method, comprising:
fabricating a conductive structure on a low density interconnect (LDI) printed circuit board (PCB); and
forming two or more conductive traces from conductive material of the conductive structure by performing a fine feature formation (FFF) process, the FFF process to comprise removing conductive material of the conductive structure along an excision path to form a fine gap region within the conductive structure.

19. The method of claim 18, the fabrication of the conductive structure according to the LDI fabrication process to comprise implementing a minimum trace width of approximately 100 μm and a minimum trace spacing of approximately 100 μm.

20. The method of claim 18, the FFF process to comprise removing the conductive material via a laser ablation process.

21. The method of claim 18, the two or more conductive traces to comprise breakout tracks for a connection array on the LDI PCB.

22. The method of claim 21, the connection array to comprise an inter-element pitch of approximately 0.8 mm.

23. The method of claim 21, the connection array to comprise an inter-element pitch of approximately 1.0 mm.

24. The method of claim 18, comprising forming a crosstalk mitigation structure by performing the FFF process to form two conductive traces from conductive material of the conductive structure.

25. The method of claim 18, the fine gap region to comprise a width of approximately 50 μm or less.

* * * * *